(12) United States Patent
Hazama

(10) Patent No.: US 6,260,172 B1
(45) Date of Patent: Jul. 10, 2001

(54) SEMICONDUCTOR DEVICE WITH LOGIC REWRITING AND SECURITY PROTECTION FUNCTION

(75) Inventor: Katsuki Hazama, Chiyoda-ku (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 09/168,116

(22) Filed: Oct. 8, 1998

Related U.S. Application Data

(63) Continuation-in-part of application No. 08/928,462, filed on Sep. 12, 1997, now Pat. No. 6,089,460, and a continuation-in-part of application No. 08/931,519, filed on Sep. 16, 1997, now Pat. No. 6,023,781.

(30) Foreign Application Priority Data

| Sep. 5, 1997 | (JP) | 9-257561 |
| Sep. 9, 1997 | (JP) | 9-261041 |
| Dec. 12, 1997 | (JP) | 9-363012 |
| May 1, 1998 | (JP) | 10-121893 |

(51) Int. Cl.$^7$ .................................................. G11C 29/00
(52) U.S. Cl. ......................... 714/773; 713/200; 711/163
(58) Field of Search ...................... 714/38, 773; 365/149; 375/200; 380/50; 455/557; 713/200; 395/500; 340/825.3, 825.31; 711/163

(56) References Cited

U.S. PATENT DOCUMENTS

| 5,452,442 | * | 9/1995 | Kephart | 714/38 |
| 5,537,540 | * | 7/1996 | Miller et al. | 714/38 |
| 5,684,736 | * | 11/1997 | Chan | 365/149 |
| 5,715,274 | * | 2/1998 | Rostoker et al. | 375/200 |
| 5,745,734 | * | 4/1998 | Craft et al. | 395/500 |
| 5,805,712 | * | 9/1998 | Davis | 380/50 |
| 5,896,574 | * | 4/1999 | Bass, Sr. | 455/557 |
| 5,918,008 | * | 6/1999 | Togawa et al. | 713/200 |

FOREIGN PATENT DOCUMENTS

361107487 * 5/1986 (JP).

* cited by examiner

Primary Examiner—Albert DeCady
Assistant Examiner—David Ton
(74) Attorney, Agent, or Firm—Connolly Bove Lodge & Hutz LLP

(57) ABSTRACT

A semiconductor device is provide with a logic-rewritable logic integrated circuit having a field programmable gate array storing logic data which is rewritable in response to an external command signal. Compared with each other are first data which is included in at least a reference signal and is related to the logic data of the logic integrated circuit and second data included in a command signal. Rewriting of the logic data is controlled according to a result of the comparison. Rewriting of the logic data may be prohibited when the first and second data are not identical to each other. It may be judged that the logic data has been rewritten when the first and second data are not identical to each other. The command signal may be compared with a plurality of reference signals, such as known viruses. Rewriting of the logic data is prohibited when the command signal and any one of the plurality of reference signals is identical to each other.

15 Claims, 22 Drawing Sheets

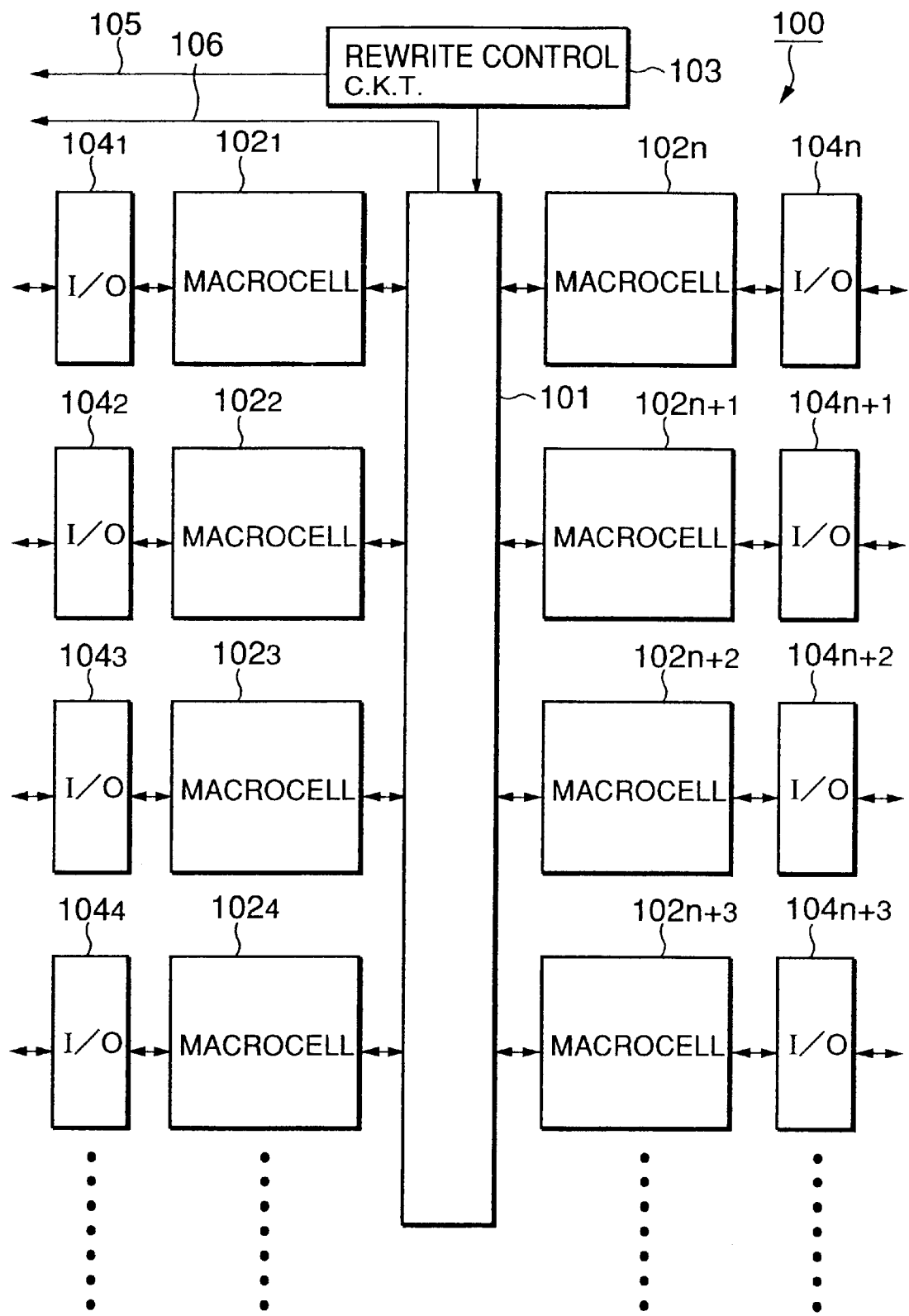
F I G. 1

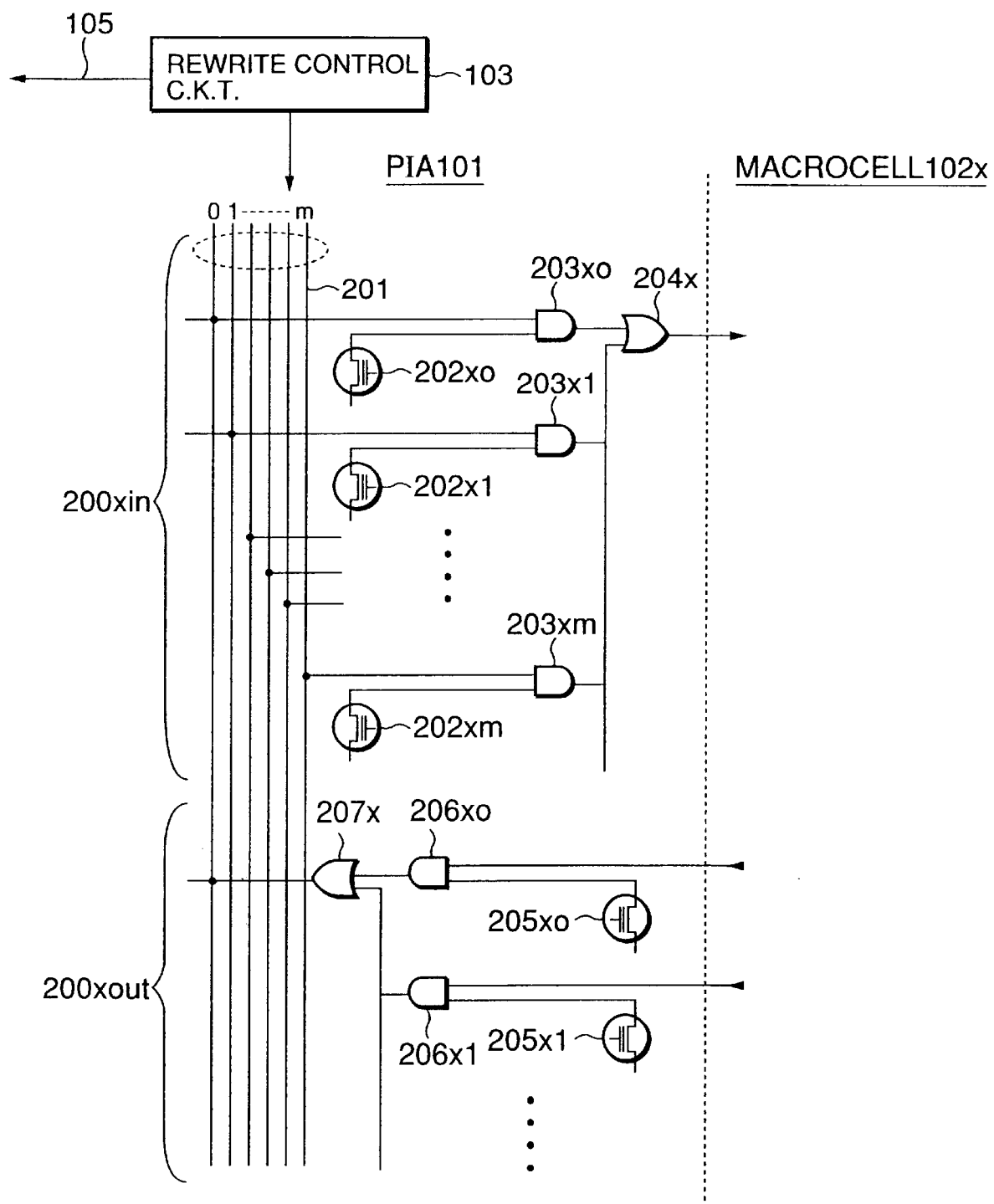
F I G. 2

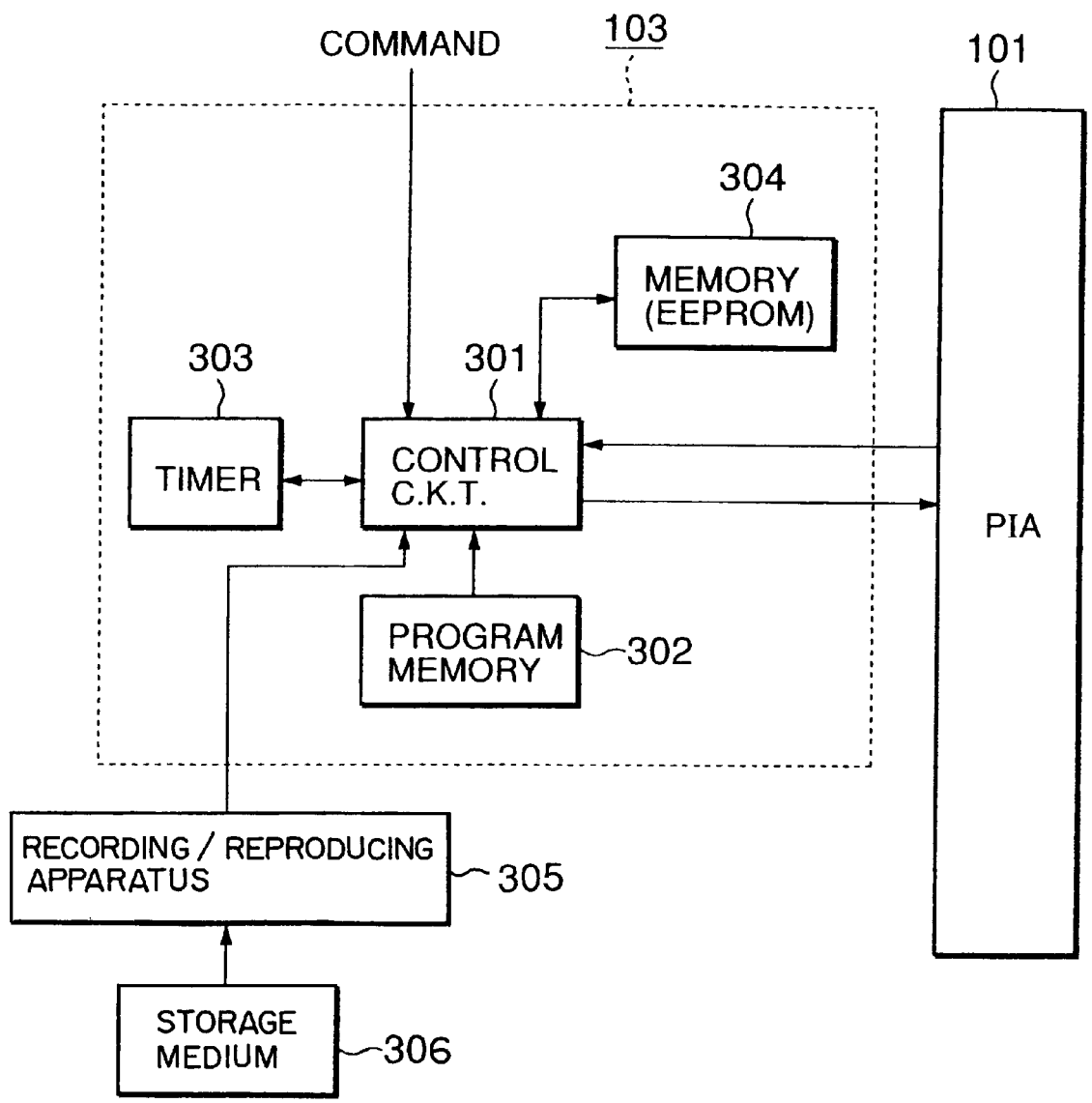
F I G. 4

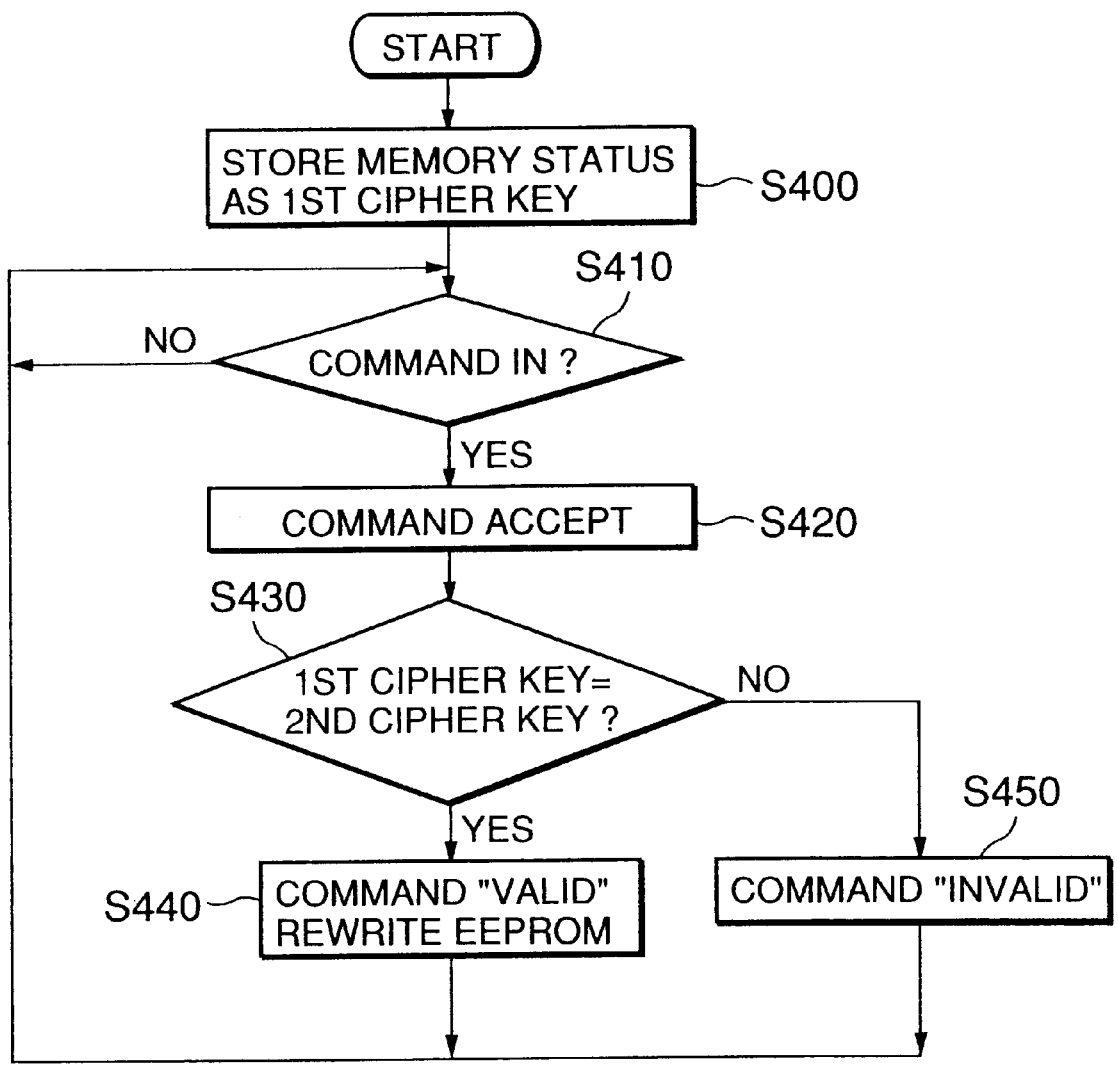
F I G. 5

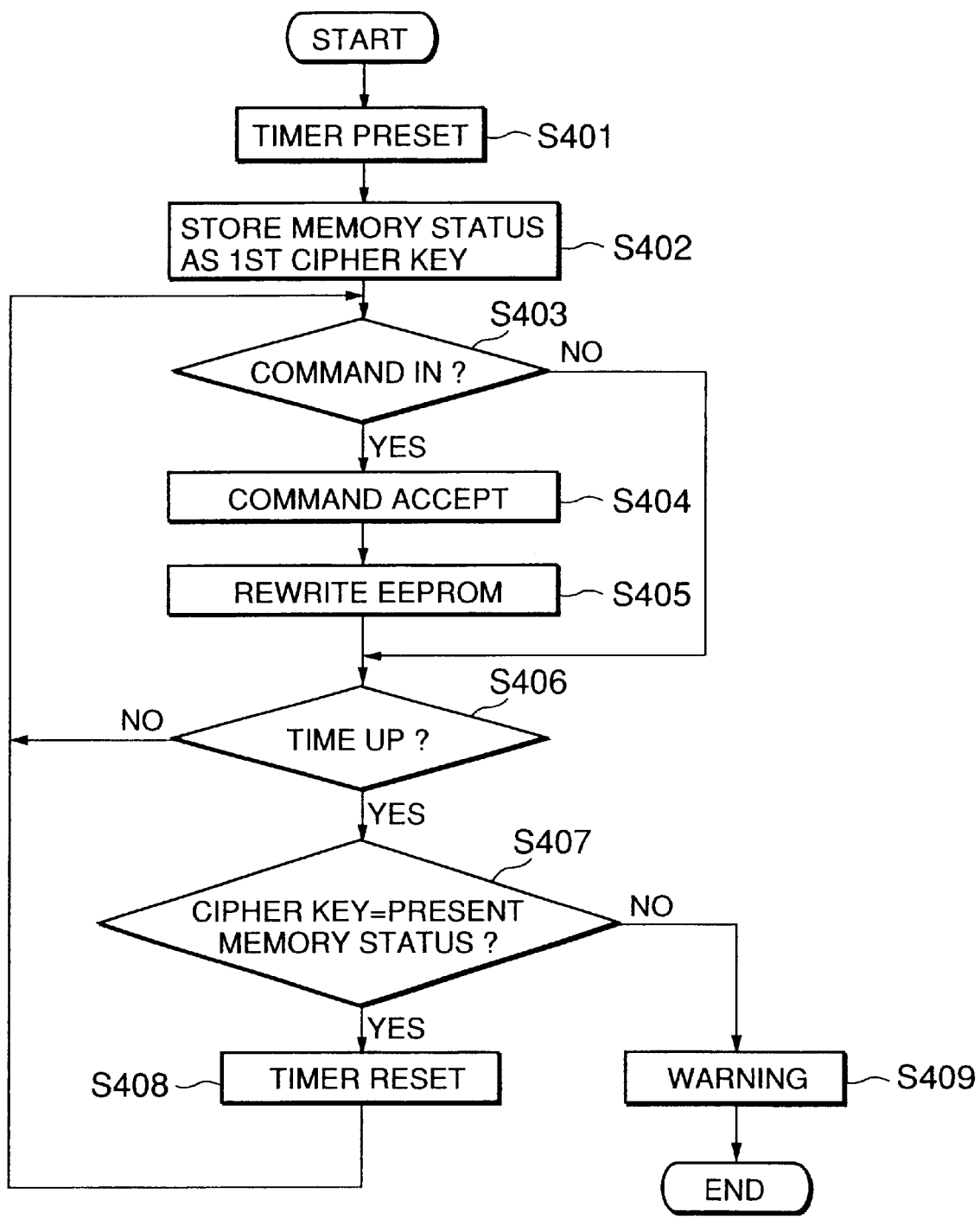
F I G. 6

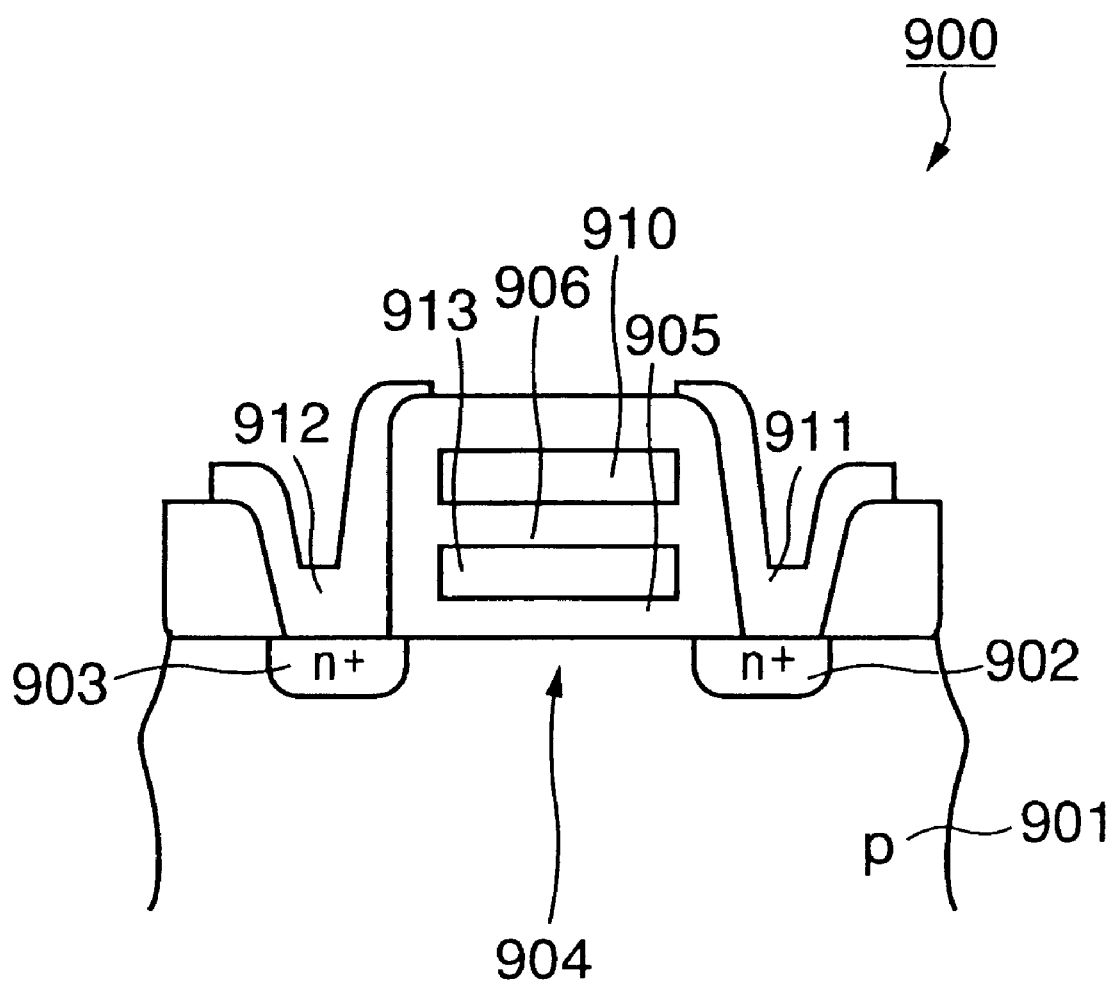
F I G. 7

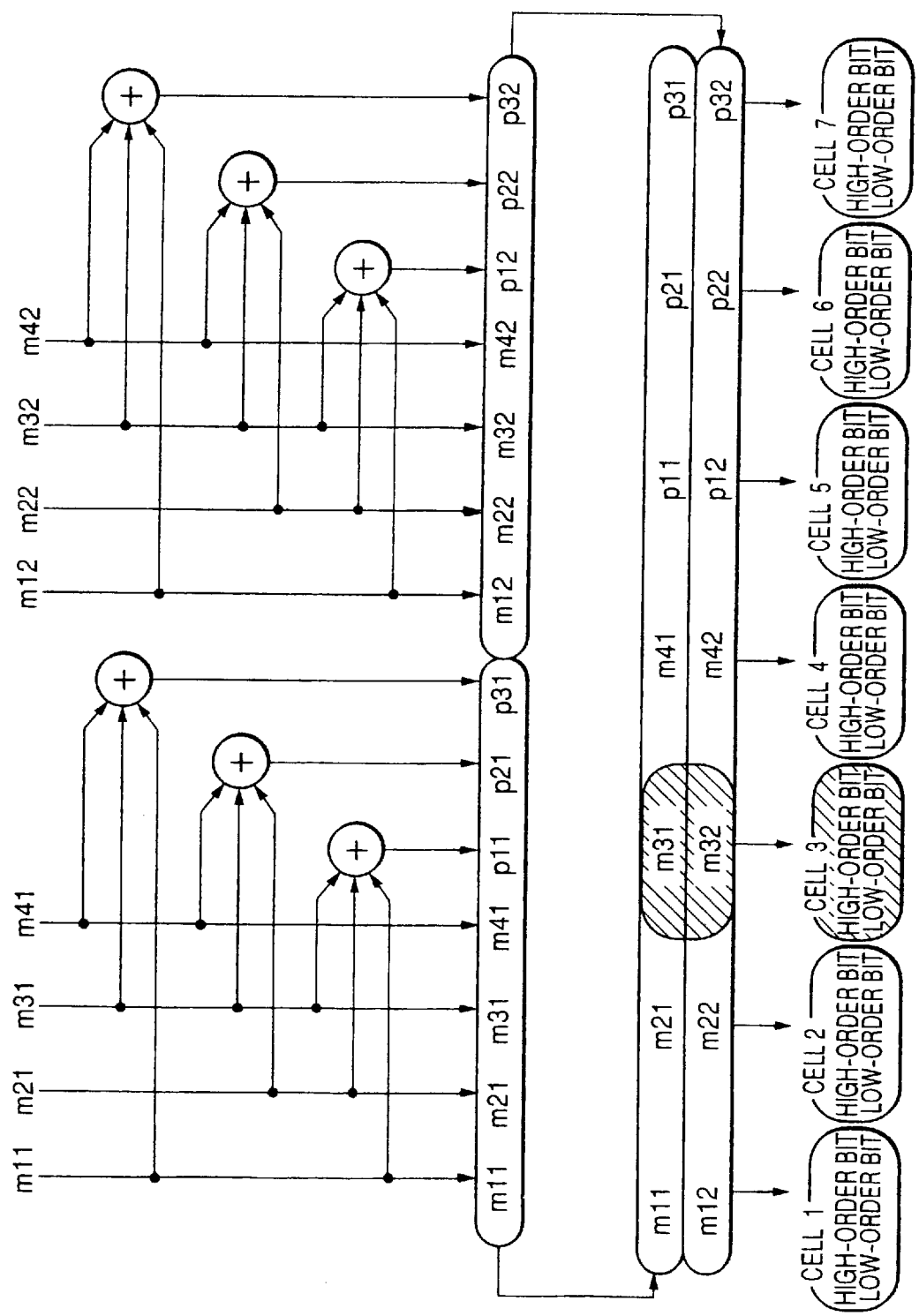
F I G. 8

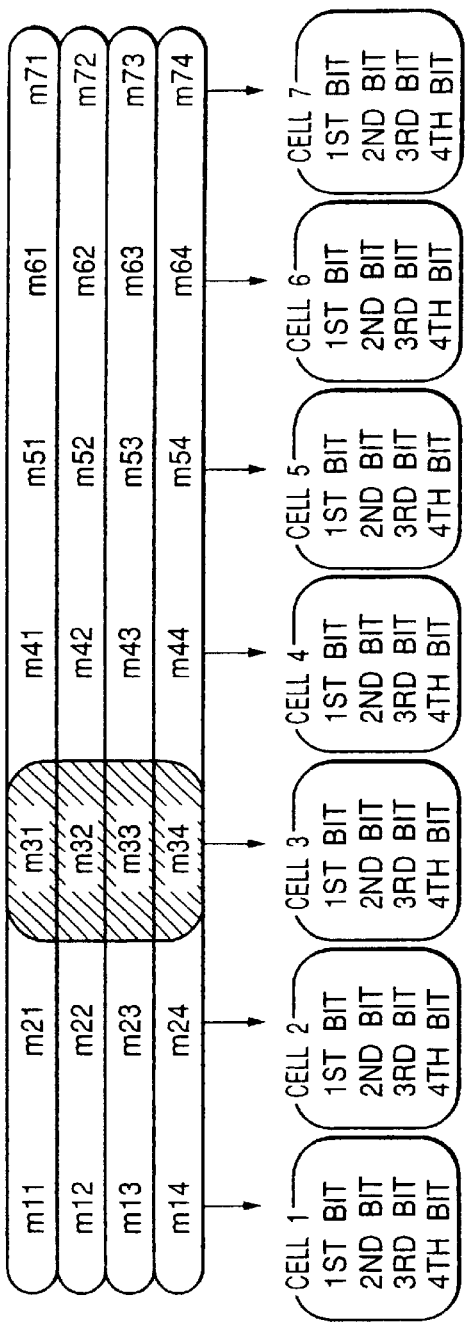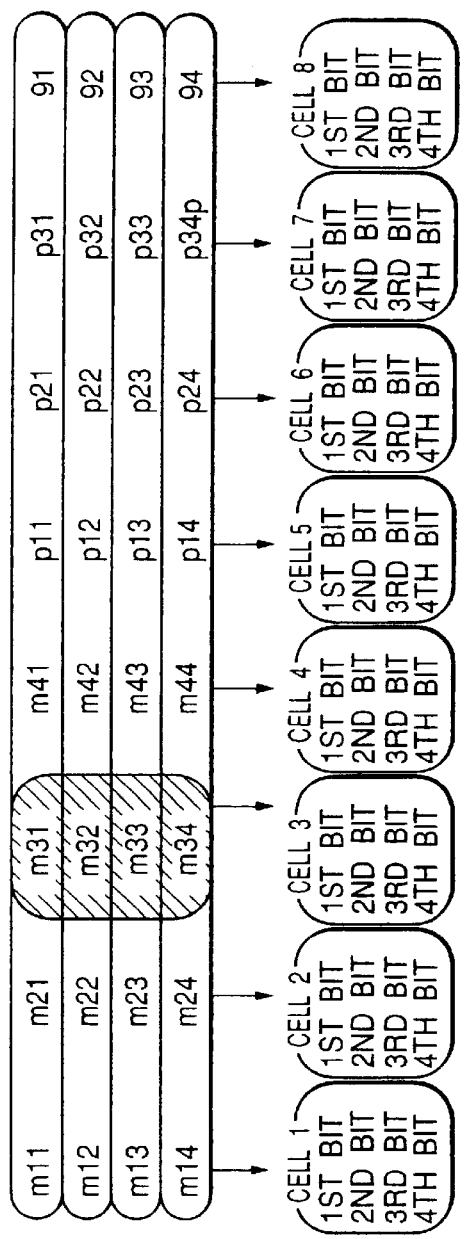

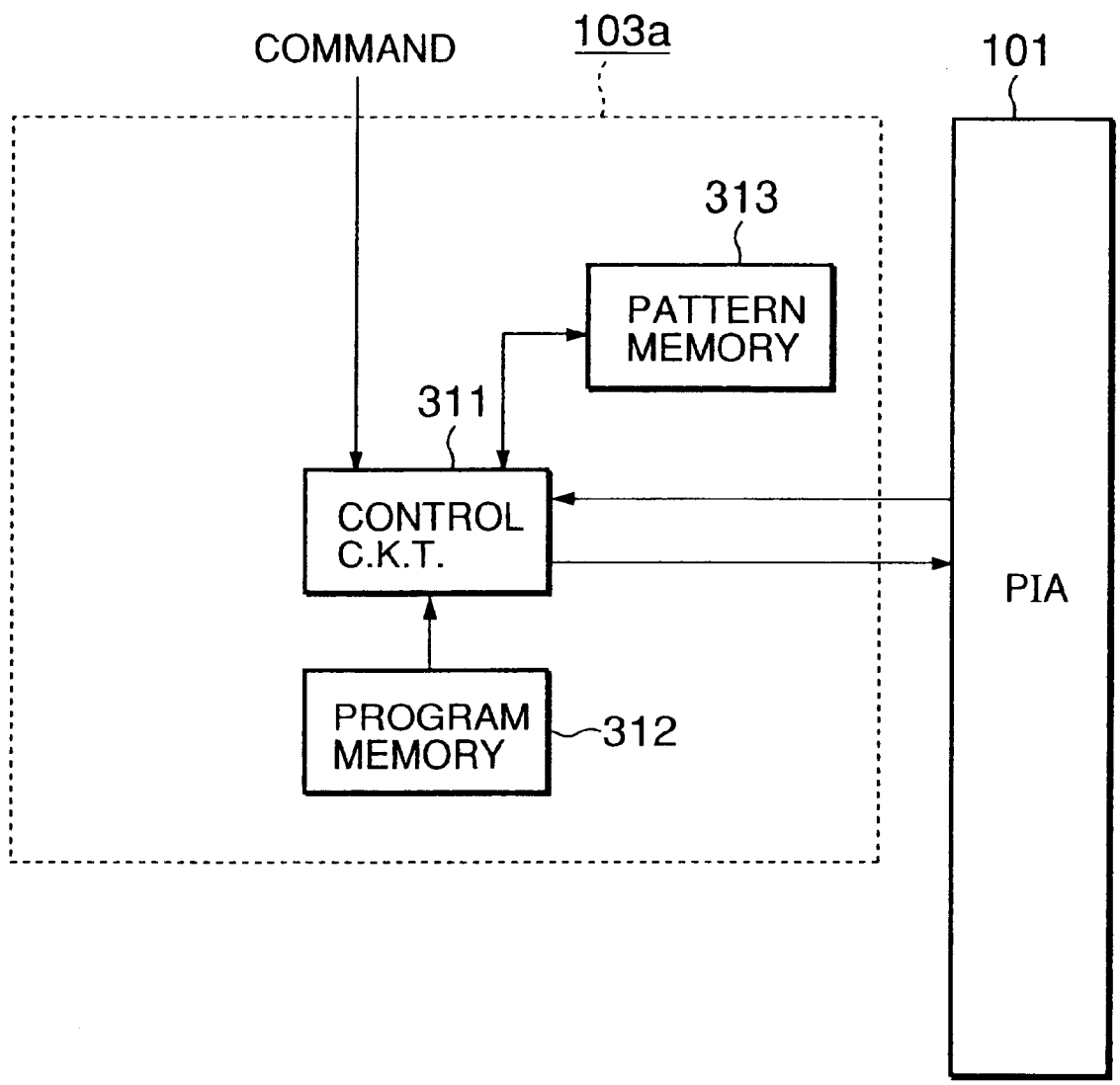
F I G. 14

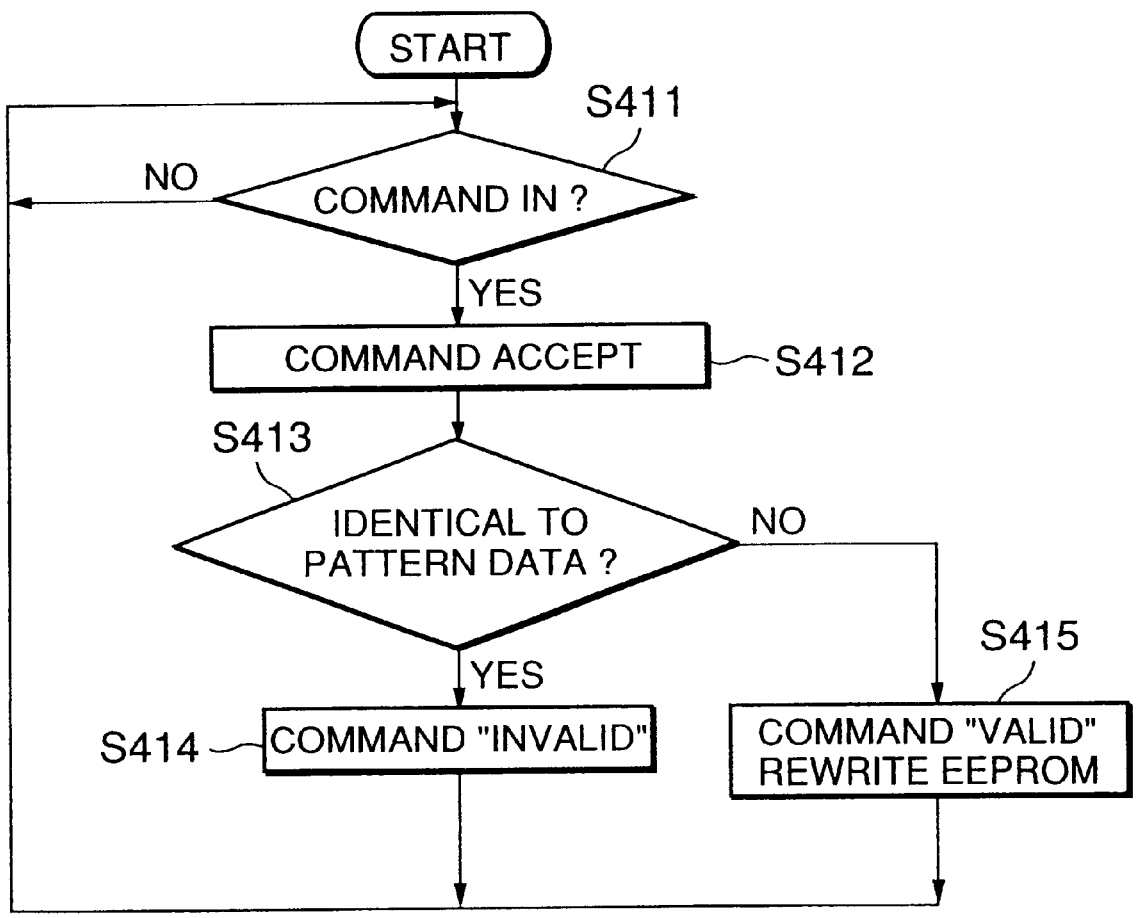
F I G. 15

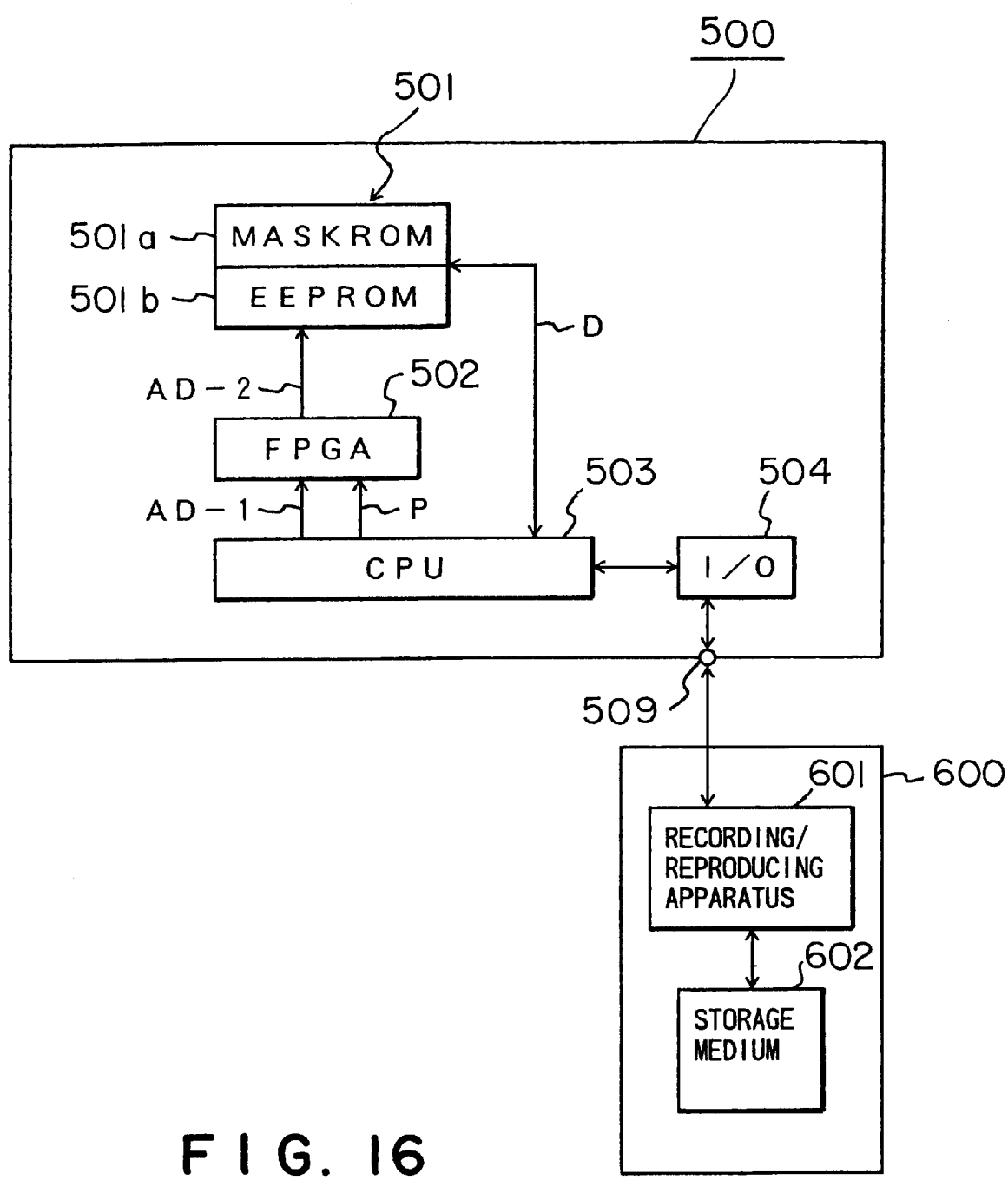
F I G. 16

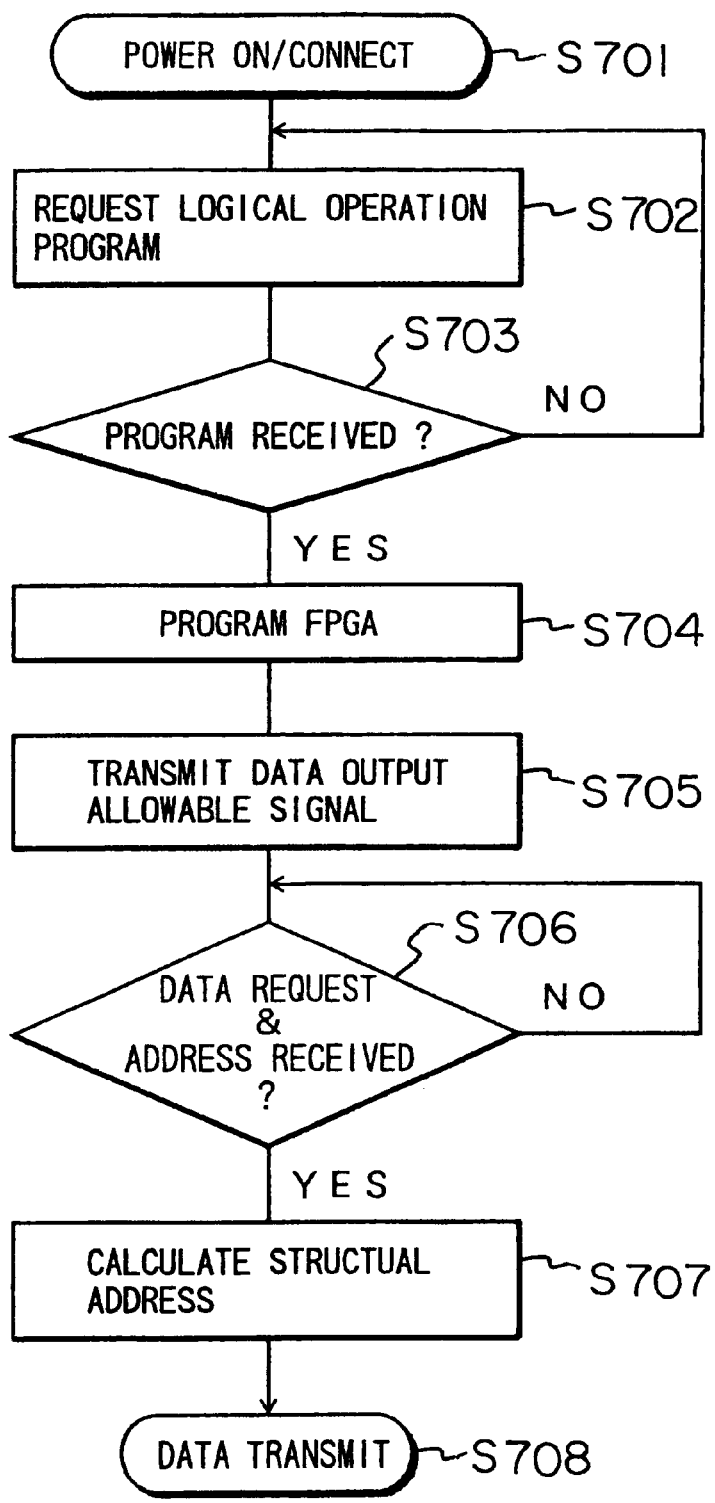
F I G. 17

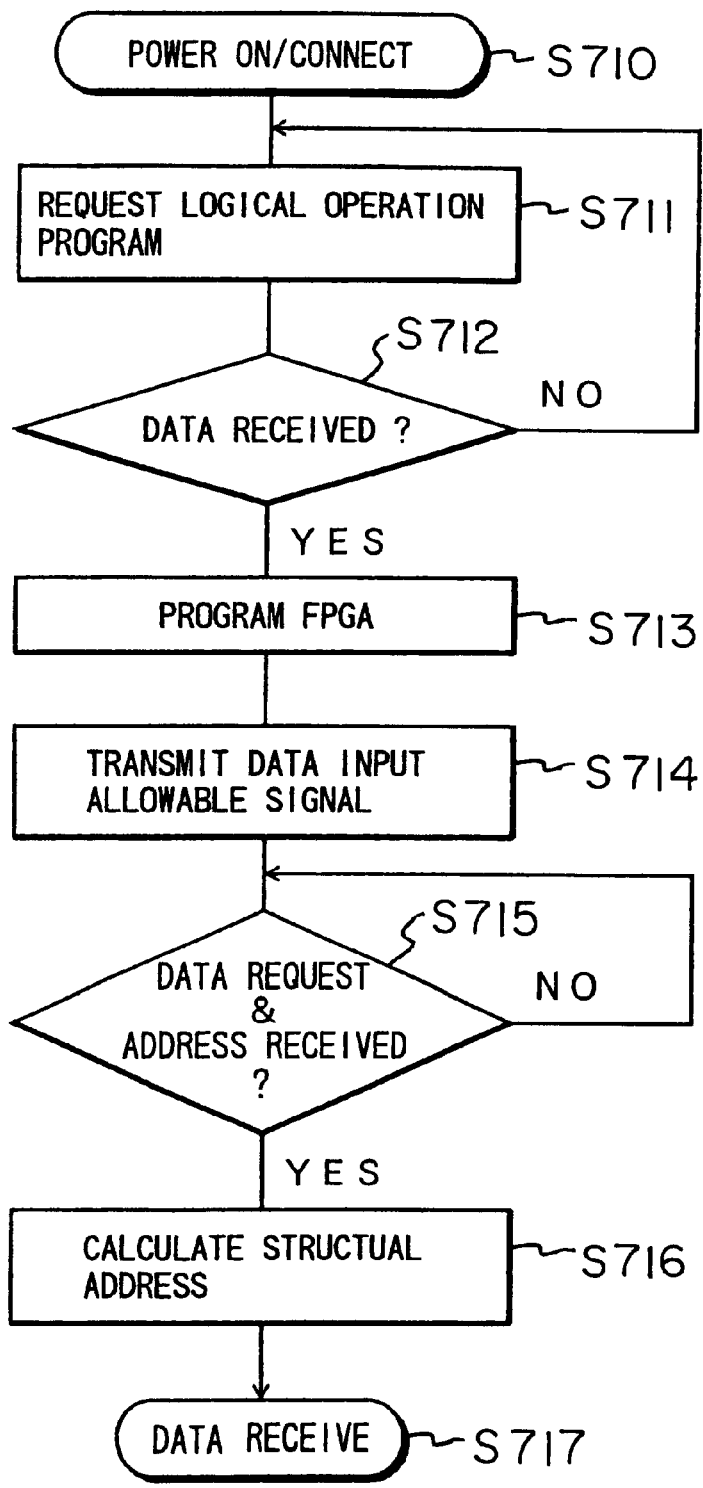
F I G. 18

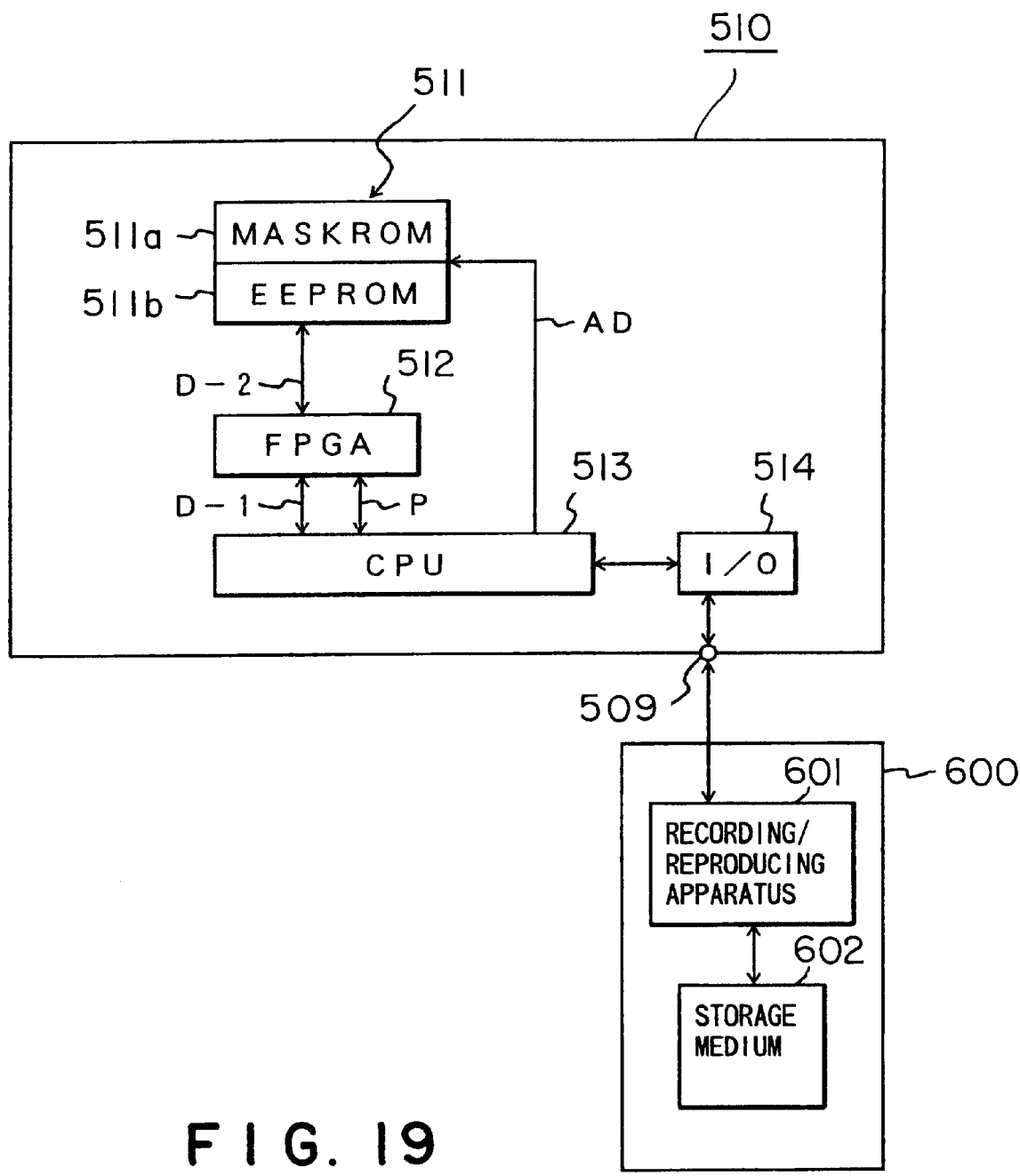
F I G. 19

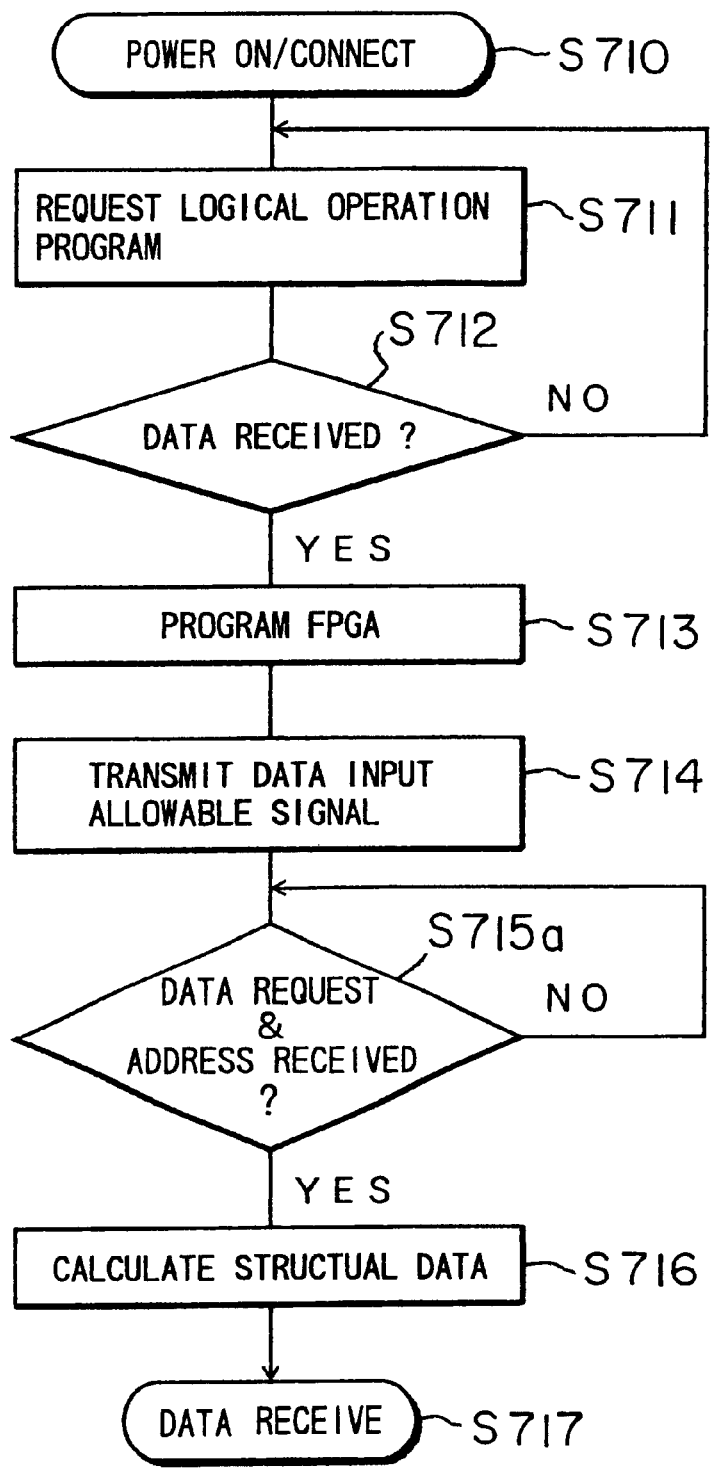
F I G. 21

SEMICONDUCTOR DEVICE WITH LOGIC REWRITING AND SECURITY PROTECTION FUNCTION

This application is a continuation-in-part-application of U.S. patent application Ser. No. 08/928, 462 filed on Sep. 12, 1997, now U.S. Pat. No. 6,089,460 and U.S. patent application Ser. No. 08/931,519 filed on Sep. 16, 1997, now U.S. Pat. No. 6,023,781.

BACKGROUND OF THE INVENTION

The present invention relates to an electrically changeable (rewritable) logic integrated circuit with security protection function.

There has been a strong demand for rewritable logic integrated circuits suitable for a shorter term for logic integrated circuit development or modification after shipment. The logic integrated circuits are freely rewritable to constitute circuits with completely different logic functions. And, these logic integrated circuits have been used for communications equipment such as mobile phones, add-on boards of computers, video-game apparatus and Karaoke-apparatus, etc.

On the other hand, virus programs have been spread all over the world to rewrite, without authorization, programs or data stored in rewitable storage media for computers, such as hard disks, floppy discs, BIOS flush memories. The virus programs are infected from one to other computers through communications media or floppy discs, etc. These virus programs have given extensive damage to computer users because some of them destroy the data or programs to cause malfunction of computers.

In order to protect computers from the virus programs, vaccine programs have been widely used as a means for preventing infection of the virus programs or heal the damaged data or program.

For example, Japanese patent Laid-Open No. 8(1996)-179942 describes a computer system with virus program detection function. Further, Japanese patent Laid-Open No. 8(1996)-22390 describes a system for judging whether data or software of a computer is rewritten.

A semiconductor device provided with the security protection function is disclosed in Japanese Patent Laid-Open No. 4(1992)-232588. Particularly, this device is provided with the security protection function for IC cards. The semiconductor device includes a ROM for storing a software for basic control, etc., an EEPROM for storing a program for ciphering and a ciphering key, a RAM for storing identification number of a manufacturer, etc., and a CPU for controlling the ciphering function.

Further, Japanese Patent Laid-Open No. 4(1992)-11420 discloses a one-chip microcomputer provided with a non-volatile memory for storing ID data to be ciphered, a ciphering circuit for ciphering the ID data, a control circuit, etc.

Further, Japanese Patent Laid-Open No. 63(1988)-293637 discloses a one-chip microcomputer provided with a non-volatile memory (ROM) for storing ciphered program and ID data, a volatile memory (RAM) for storing keys for ciphering and deciphering, and a rewritable memory (EEPROM) for storing data ciphered by the ciphering key.

Since the rewritable logic integrated circuits have been used in fields where security protection is required, the same as computers, there is a demand for logic protection function for such rewritable logic integrated circuits against virus programs.

The methods against virus programs described, for example, in Japanese patent Laid-Open Nos. 8(1996)-179942 and -22390 are used for data or software of a computer. However, these cannot be used for logic of rewritable logic integrated circuits. There have been no way to protect logic of rewritable logic integrated circuits from being rewritten without authorization.

Further, in the semiconductor device provided with the security protection function, the EEPROMs of these semiconductor device have relatively large area required for one-bit data, there exists a problem in that a high integration is difficult to achieve. In addition, in these devices, since the secret data are ciphered and deciphered by processing programs by use of a CPU, there exist other problems in that a relatively long time is required to output data and further in that the CPU cannot execute another processing while the data are being output. This device may also be infected by virus to destroy the stored data, thus causing malfunction.

As described above, in the semiconductor devices provided with a security protection function, there exists a problem in that a high integration is difficult and thereby the device cannot be manufactured at a low cost. In addition, the semiconductor devices involve such a problem that the stored data cannot be output at high speed and further another different processing cannot be executed by the arithmetic unit while the data are being output. Further, a normal operation cannot be secured against virus programs.

SUMMARY OF THE INVENTION

With these problems in mind, therefore, it is a first object of the present invention to provide protection of logic of a rewritable logic integrated circuit from being destroyed.

It is a second object of the present invention to provide a semiconductor device with security protection function of stored contents, which can be operated at high speed and manufactured at low cost.

It is a third object of the present invention to provide a storage medium for storing software for activating the semiconductor device to conduct the security protection function.

It is a fourth object of the present invention to provide a semiconductor device with security protection function and capable of non-contact communications with terminal equipment.

To achieve the above-mentioned object, the present invention provides a semiconductor device comprising: a logic integrated circuit having a field programmable gate array storing logic data which is rewritable in response to an external command signal; comparing means for comparing first data being included in at least a reference signal and being related to the logic data of the logic integrated circuit and second data included in a command signal; and control means for controlling rewriting of the logic data according to a result of the comparison.

A method of preventing rewriting of logic may comprise the steps of: comparing a first data related to a first logical state indicating a present state of a logic integrated circuit capable of changing the logic thereof in response to an external command signal and a second data included in the command signal and related to a second logical state of the logic integrated circuit; and prohibiting rewriting of the logic of the logic integrated circuit from the first to the second logical state when the first and second data are not identical to each other. The comparing step may compare at least either one of a first number of logic elements used for constituting the first logical state among a plurality of logic elements included in the logic integrated circuit, a second number of logic elements not used for constituting the first logical state among the plurality of logic elements, addresses of the logic elements used or not used for constituting the first logical state, a code obtained by compressing a signal indicating the first or the second number of elements or the addresses, a date when the logic integrated circuit has been rewritten the logic thereof from the first to the second logical state as the first data with the second data.

A logic judging method may comprise the steps of detecting a first data in response to an external command signal, the first data being related to a first logical state indicating a present state of a logic integrated circuit, the logic being rewritable according to the command signal, comparing the first data with a second data related to a second logical state indicating a state prior to the present state of the logic integrated circuit, and judging that the logic of the logic integrated circuit has been rewritten from the second to the first logical state when the first and second data are not identical to each other. The judging step may output a judging signal when the controller judges that the logic of the logic integrated circuit has been rewritten. The comparing step may compare at least either one of a first number of logic elements used for constituting the second logical state among a plurality of logic elements included in the logic integrated circuit, a second number of logic elements not used for constituting the second logical state among the plurality of logic elements, addresses of the logic elements used or not used for constituting the second logical state, a code obtained by compressing a signal indicating the first or the second number of elements or the addresses, a date when the logic integrated circuit has been rewritten the logic thereof from the first to the second logical state as the second data with the first data.

A method of preventing logic rewriting may comprise the steps of comparing an external command signal and at least a reference signal, the command signal being supplied to a logic-rewritable logic integrated circuit capable of changing logic thereof in response to the command signal, and prohibiting the logic rewriting when the command signal and the reference signal are identical to each other. The comparing step may compare a plurality of reference signals with the command signal.

A computer readable medium may store program code for causing a computer to apply a program for preventing logic of a logic integrated circuit capable of changing the logic thereof in response to an external command signal. The program code may comprise a first program code means for comparing a first data related to a first logical state indicating a present state of the logic integrated circuit and a second data included in the command signal and related to a second logical state of the logic integrated circuit, and a second program code means for prohibiting rewriting of the logic of the logic integrated circuit from the first to the second logical state when the first and second data are not identical to each other. The first program code means may comprise a program code means for comparing at least either one of a first number of logic elements used for constituting the first logical state among a plurality of logic elements included in the logic integrated circuit, a second number of logic elements not used for constituting the first logical state among the plurality of logic elements, addresses of the logic elements used or not used for constituting the first logical state, a code obtained by compressing a signal indicating the first or the second number of elements or the addresses, a date when the logic integrated circuit has been rewritten the logic thereof from the second to the first logical state as the first data with the second data.

A computer readable medium may store program code for causing a computer to apply a program for judging a logic of a logic integrated circuit capable of changing the logic thereof in response to an external command signal. The program code may comprise a first program code meas for detecting a first data related to a first logical state indicating a present state of the logic integrated circuit in response to the command signal, a second program code means for comparing the first data with a second data related to a second logical state of the logic integrated circuit prior to the present state, and a third program code means for judging that he logic of the logic integrated circuit has been rewritten from the second to the first logical state when the first and second data are not identical to each other. The third program code means may include a program code means for outputting a judging signal when judged that the logic of the logic integrated circuit has been rewritten. The program code may further comprise a program code means for repeating the first, second and third program code means. The second program code means may comprise a program code means for comparing at least either one of a first number of logic elements used for constituting the second logical state among a plurality of logic elements included in the logic integrated circuit, a second number of logic elements not used for constituting the second logical state among the plurality of logic elements, addresses of the logic elements used or not used for constituting the second logical state, a code obtained by compressing a signal indicating the first or the second number of elements or the addresses, a date when the logic integrated circuit has been rewritten the logic thereof from the first to the second logical state as the second data with the first data.

A computer readable medium storing program code for causing a computer to apply a program for preventing logic of a logic integrated circuit capable of changing the logic thereof in response to an external command signal, may comprise: first program code means for comparing the command signal and at least a reference signal; and second program code means for prohibiting rewriting of the logic of the logic integrated circuit when the command signal and the reference signal are identical to each other. The first program code means may comprise a program code means for comparing the command signal with a plurality of reference signals.

A semiconductor device with security protection function may comprise: control means having at least temporarily a code processing program for generating a command signal corresponding to the program; logic-rewritable logic means responsive to the command signal for changing logic thereof in accordance with the program and for applying the code processing to at least either data or an address related to the data on the basis of the rewritten logic; first memory means for storing the data; and means for comparing a first data related to a first logical state indicating a present state of the logic means and a second data included in the command signal and related to a second logical state of the logic means to prohibit rewriting of the logic of the logic means from the first to the second logical state when the first and second data are not identical to each other. The semiconductor devise may further comprise second memory means for storing at least either one of a first number of logic elements used for constituting the first logical state among a plurality of logic elements included in the logic integrated circuit, a second number of logic elements not used for constituting the first logical state among the plurality of logic elements, addresses of the logic elements used or not used for constituting the first logical state, a code obtained by compressing a signal indicating the first or the second number of elements or the addresses, a date when the logic integrated circuit has been rewritten the logic thereof from the second to the first logical state as the first data.

A semiconductor device with security protection function may comprise: control means having at least temporarily a code processing program for generating a command signal corresponding to the program; logic-rewritable logic means responsive to the command signal for changing logic thereof in accordance with the program and for applying the code processing to at least either data or an address related to the data on the basis of the rewritten logic; first memory means for storing the data; and judging means for detecting a first data related to a first logical state indicating a present state of the logic means in response to the command signal, comparing the first data with a second data related to a second logical state of the logic means prior to the present state to judge that the logic of the logic means has been rewritten from the second to the first logical state when the first and second data are not identical to each other. The judging means may output a judging signal when judged that the logic of the logic integrated circuit has been rewritten. The judging means may periodically conduct the judging operation.

The semiconductor devise may further comprise second memory means for storing at least either one of a first number of logic elements used for constituting the second logical state among a plurality of logic elements included in the logic integrated circuit, a second number of logic elements not used for constituting the second logical state among the plurality of logic elements, addresses of the logic elements used or not used for constituting the second logical state, a code obtained by compressing a signal indicating the first or the second number of elements or the addresses, a date when the logic integrated circuit has been rewritten the logic thereof from the first to the second logical state as the second data.

A semiconductor device with security protection function may comprise: control means having at least temporarily a code processing program for generating a command signal corresponding to the program; logic-rewritable logic means responsive to the command signal for changing logic thereof in accordance with the program and for applying the code processing to at least either data or an address related to the data on the basis of the rewritten logic; first memory means for storing the data; and prohibiting means for comparing the command signal and at least a reference signal to prohibit rewriting of the logic of the logic integrated circuit when the command signal and the reference signal are identical to each other. The logic means may include a multi-level memory of at least a member of the group consisting of an MNOS, a mask ROM, an EEPROM, an EPROM, a PROM, a FRAM and a non-volatile flash memory.

A method of code processing used for a semiconductor device having a logic-rewritable logic circuit and a control device for controlling the logic circuit, may comprise the steps of: supplying a code processing program to the control device; outputting a command signal corresponding to the program from the control device; applying the command signal to the logic circuit to rewriting logic thereof in accordance with the program; applying the program to at least either data or an address related to the data on the basis of the rewritten logic; and storing the data in a memory device, wherein the logic changing step includes the steps of: comparing a first data related to a first logical state indicating a present state of the logic circuit and a second data related to a second logical state of the logic circuit included in the command signal; and prohibiting rewriting of the logic of the logic circuit from the first to the second logical state when the first and second data are not identical to each other. The comparing step may compare at least either one of a first number of logic elements used for constituting the first logical state among a plurality of logic elements included in the logic integrated circuit, a second number of logic elements not used for constituting the first logical state among the plurality of logic elements, addresses of the logic elements used or not used for constituting the first logical state, a code obtained by compressing a signal indicating the first or the second number of elements or the addresses, a date when the logic integrated circuit has been rewritten the logic thereof from the second to the first logical state as the first data and the second data.

A code processing method for a semiconductor device having a logic rewritable logic circuit with a security protection function and a controller to control the logic circuit may comprise the steps of: supplying a code processing program to the controller; generating a command signal corresponding to the program from the controller; changing logic of the logic circuit in accordance with the program; applying the code processing to at least either data or an address related to the data on the basis of the rewritten logic; storing the data in a memory, wherein the logic changing step may include the steps of: detecting a first data related to a first logical state indicating a present state of the logic circuit in response to the command signal; comparing the first data with a second data related to a second logical state of the logic circuit prior to the present state; and judging that the logic of the logic means ha been rewritten from the second to the first logical state when the first and second data are not identical to each other. The judging step may comprise the step of outputting a judging signal when judged that the logic of the logic integrated circuit has been rewritten. The steps included in the logic changing step may be periodically conducted. The comparing step may compare at least either one of a first number of logic elements used for constituting the second logical state among a plurality of logic elements included in the logic integrated circuit, a second number of logic elements not used for constituting the second logical state among the plurality of logic elements, addresses of the logic elements used or not used for constituting the second logical state, a code obtained by compressing a signal indicating the first or the second number of elements or the addresses, a date when the logic integrated circuit has been rewritten the logic thereof from the first to the second logical state as the second data and the first data.

A method of code processing used for a semiconductor device having a logic-rewritable logic circuit and a control device for controlling the logic circuit, may comprise the steps of: supplying a code processing program to the control device; outputting a command signal corresponding to the program from the control device; applying the command signal to the logical circuit to rewriting logic thereof in accordance with the program; applying the program to at least either data or an address related to the data on the basis of the rewritten logic; and storing the data in a memory device, wherein the logic changing step includes the steps of: comparing the command signal and at least a reference signal; and prohibiting rewriting of the logic of the logic circuit when the command signal and the reference signal are identical to each other. The comparing step may compare the command signal with a plurality of reference signals. The program applying step may apply a program including either of a ciphering or deciphering program. The program applying step may apply a ciphering program to the data or the address before the data is stored in the memory device. The program applying step may apply a ciphering program to the data or the address when the data is output from the memory device. The program applying step may apply a deciphering program to the data or the address when the data is output from the memory device. The storing step may store the data on the ciphered address of the memory device.

A computer readable medium may store program code for causing a computer to apply a program for code processing to data of a semiconductor device having a logic-rewritable logic circuit and a control device for controlling the logic circuit. The program code may comprise: a first program code means for supplying a code processing program to the control device; a second program code means for outputting a command signal corresponding to the program from the control device; a third program code means for applying the command signal to the logical circuit to rewrite logic thereof in accordance with the program; a fourth program code means for applying the program to at least either data or an address related to the data on the basis of the rewritten logic; and a fifth program code means for storing the data in a memory device, wherein the third program code means includes: a comparing program code means for comparing a first data related to a first logical state indicating a present state of the logic circuit with a second data related to a second logical state of the logic circuit prior to the present state included in the command signal; and a prohibiting program code means for prohibiting rewriting of the logic of the logic circuit from the first to the second logical state when the first and the second data are not identical to each other. The comparing program code means may comprise a program code means for comparing at least either one of a first number of logic elements used for constituting the first logical state among a plurality of logic elements included in the logic integrated circuit, a second number of logic elements not used for constituting the first logical state among the plurality of logic elements, addresses of the logic elements used or not used for constituting the first logical state, a code obtained by compressing a signal indicating the first or the second number of elements or the addresses, a date when the logic integrated circuit has been rewritten the logic thereof from the second to the first logical state as the first data and the second data.

A computer readable medium may store program code for causing a computer to apply a program for code processing to data of a semiconductor device having a logic-rewritable logic circuit and a control device for controlling the logic circuit. The program code may comprise: first program code means for supplying a code processing program to the control device; a second program code means for outputting a command signal corresponding to the program from the control device; a third program code means for applying the command signal to the logical circuit to rewrite logic thereof in accordance with the program; a fourth program code means for applying the program to at least either data or an address related to the data on the basis of the rewritten logic; and a fifth program code means for storing the data in a memory device, wherein the third program code means includes: a detecting program code means for detecting a first data related to a first logical state indicating a present state of the logic circuit in response to the command signal; comparing program code means for comparing the first data with a second data related to a second logical state of the logic circuit prior to the present state included in the command signal; and a judging program code means for judging that the logic of the logic circuit has been rewritten from the second to the first logical state when the first and the second data are not identical to each other. The judging program code means may include a program code means for outputting a judging signal when judged that the logic of the logic integrated circuit has been rewritten. The program code may further include a program code means for repeating the detecting, comparing and judging programs. The comparing program code means may comprise a program code means for comparing at least either one of a first number of logic elements used for constituting the second logical state among a plurality of logic elements included in the logic integrated circuit, a second number of logic elements not used for constituting the second logical state among the plurality of logic elements, addresses of the logic elements used or not used for constituting the second logical state, a code obtained by compressing a signal indicating the first or the second number of elements or the addresses, a date when the logic integrated circuit has been rewritten the logic thereof from the first to the second logical state as the second data and the first data.

A computer readable medium may store program code for causing a computer to apply a program for code processing to data of a semiconductor device having a logic-rewritable logic circuit and a control device for controlling the logic circuit. The program code may comprise: first program code means for supplying a code processing program to the control device; second program code means for outputting a command signal corresponding to the program from the control device; third program code means for applying the command signal to the logical circuit to rewrite logic thereof in accordance with the program; fourth program code means for applying the program to at least either data or an address related to the data on the basis of the rewritten logic; and fifth program code means for storing the data in a memory device, wherein the third program code means includes: comparing program code means for comparing the command signal with at least a reference signal; and prohibiting program code means for prohibiting rewriting the logic of the logic circuit when the command signal and the reference signal are identical to each other. The comparing program code means may comprises a program code means for comparing the command signal with a plurality of reference signals. The fourth program code means may comprises a program code means for applying at least either a ciphering or decipher program. The fourth program code means may comprise a program code means for apply a ciphering program to the data or the address before the data is stored in the memory device. The fourth program code means may comprise a program code means,for applying a ciphering program to the data or the address when the data is output from the memory device. The fourth program code means may comprise a program code means for applying a deciphering program to the data or the address when the data is output from the memory device. The fourth program code means may comprise a program code means for storing the data on the ciphered address of the memory device.

A semiconductor device a with security protection function may have logic means, logic thereof being changed in response to a command signal in accordance with either a ciphering or deciphering program supplied thereto, the logic means processing a signal according to the changed logic. The logic means may comprise: a logic integrated circuit responsive to the command signal for changing logic thereof; and means for comparing a first data related to a first logical state indicating a present state of the logic integrated circuit and a second data included in the command signal and related to a second logical state of the logic means to prohibit rewriting of the logic of the logic integrated circuit from the first to the second logical state when the first and second data are not identical to each other. The semiconductor device may further comprise a memory to store at least either one of a first number of logic elements used for constituting the first logical state among a plurality of logic elements included in the logic integrated circuit, a second number of logic elements not used for constituting the first logical state among the plurality of logic elements, addresses of the logic elements used or not used for constituting the first logical state, a code obtained by compressing a signal indicating the first or the second number of elements or the addresses, a date when the logic integrated circuit has been rewritten the logic thereof from the second to the first logical state as the first data.

A semiconductor device with a security protection function may have logic means, logic thereof being changed in response to a command signal in accordance with either a ciphering or deciphering program supplied thereto, the logic means processing a signal according to the changed logic. The logic means may comprise: a logic integrated circuit responsive to the command signal for changing logic thereof; and judging means for detecting a first data related to a first logical state indicating a present state of the logic integrated circuit in response to the command signal, comparing the first data and a second data included in the command signal and related to a second logical state of the logic means to judge that the logic of the logic integrated circuit has been rewritten from the second to the first logical state when the first and second data are not identical to each other. The judging means outputs a judging signal when judged that the logic of the logic integrated circuit has been rewritten. The semiconductor device may further comprise a memory to store at least either one of a first number of logic elements used for constituting the second logical state among a plurality of logic elements included in the logic integrated circuit, a second number of logic elements not used for constituting the second logical state among the plurality of logic elements, addresses of the logic elements used or not used for constituting the second logical state, a code obtained by compressing a signal indicating the first or the second number of elements or the addresses, a date when the logic integrated circuit has been rewritten the logic thereof from the first to the second logical state as the second data.

A semiconductor device with security protection function, the semiconductor device having logic means capable of changing logic thereof in response to a command signal corresponding to at least either a ciphering or a deciphering program, the logic means processing a signal with the rewritten logic, the logic means may comprise: a logic integrated circuit capable of changing logic thereof responsive to a command signal; and prohibiting means for comparing the command signal and at least a reference signal to prohibit rewriting of the logic of the logic integrated circuit when the command signal and the reference signal are identical to each other. The semiconductor device may further comprise memory means for storing a plurality of reference signals, the prohibiting means comparing the command signal with the plurality of reference signals. The logic integrated circuit may include: a plurality of calculating means each capable of a specific calculation; and wiring means for changing wiring among the plurality of calculators in response to the command signal to rewrite the logic of the logic integrated circuit. The logic integrated circuit may include a field programmable gate array. The logic integrated circuit may include a plurality of multilevel memory cells, each cell having a control gate and a floating gate. The logic integrated circuit may include a plurality of multilevel memory cells of at least a member of the group consisting of an MNOS, a mask ROM, an EEPROM, an EPROM, a PROM, a FRAM and a non-volatile flash memory. The semiconductor device may further comprise means for changing the logic of the logic integrated circuit. The semiconductor device may further comprise means for reading the logic of the logic integrated circuit. The semiconductor device may be at least either a contact type or non-contact type. The semiconductor device may further comprise antenna means for communications of the signal with an external unit by means of an electromagnetic wave.

A method of logic rewriting may be used for a semiconductor device having a logic-rewritable logic circuit, logic thereof being rewritable in response to an external command signal, the logic circuit being provided with a plurality of multilevel memory cells storing at least three levels of data each. The method may comprise the steps of: comparing a first data related to a first logical state indicating a present state of the logic circuit and a second data related to a second logical state of the logic circuit included in the command signal; prohibiting rewriting of the logic of the logic circuit from the first to the second logical state when the first and second data are not identical to each other; when the first and second data are identical to each other, inputting a first code composed of a plurality of first data bits and a second code composed of a plurality of second data bits, the first and second codes having been coded by a coding method; arranging the first and the second data bits in order that at least a bit of an N-order of the first data bits and a bit of the N-order of the second data bits are stored in one of the cells, the N being an integral number; generating a plurality of voltages corresponding to the arranged bits; and applying the voltages to cells among the plurality of multilevel memory cells in response to address information corresponding to the cells to rewrite the logic of the logic circuit from the first to the second logical state.

Further, the present invention provides a method of changing logic, comprising the steps of: comparing an external command signal and at least one reference signal, the command signal being applied to a logic integrated circuit capable of changing logic thereof in response to the command signal and having a plurality of multilevel memory cells, each cell storing at least three levels of data each; prohibiting rewriting of the logic of the logic integrated circuit when the command signal and the reference signal are identical to each other; when the command signal and the reference signal are not identical to each other, in response to a first code composed of a plurality of first data bits and a second code composed of a plurality of second data bits, the first and second codes having been coded by a coding method, arranging the first and the second data bits in order that at least a bit of an N-order of the first data bits and a bit of the N-order of the second data bits are stored in one of the cells, the N being an integral number; generating a plurality of voltages corresponding to the arranged bits; and applying the voltages to cells among the plurality of multilevel memory cells in response to address information corresponding to the cells.

A computer readable medium may store program code for causing a computer to apply a program for rewriting logic of a logic-rewritable logic circuit in response to an external command signal, the logic circuit being provided with a plurality of multilevel memory cells storing at least three levels of data each. The program code may comprise: first program code means comparing a first data related to a first logical state indicating a present state of the logic circuit and a second data related to a second logical state of the logic circuit included in the command signal; second program code means for prohibiting rewriting of the logic of the logic circuit from the first to the second logical state when the first and second data are not identical to each other; third program code means for, when the first and second data are identical to each other, inputting a first code composed of a plurality of first data bits and a second code composed of a plurality of second data bits, the first and second codes having been coded by a coding method; fourth program code means for arranging the first and the second data bits in order that at least a bit of an N-order of the first data bits and a bit of the N-order of the second data bits are stored in one of the cells, the N being an integral number; fifth program code means for generating a plurality of voltages corresponding to the arranged bits; and sixth program code means for applying the voltages to cells among the plurality of multilevel memory cells in response to address information corresponding to the cells to rewrite the logic of the logic circuit from the first to the second logical state.

A computer readable medium storing program code for causing a computer to apply a program for preventing logic of a logic integrated circuit capable of changing logic thereof in response to an external command signal, the logic integrated circuit having a plurality of multilevel memory cells, each cell storing at least three levels of data each, the program may comprise: first program code means for comparing the command signal and at least a reference signal; second program code means for prohibiting rewriting of the logic of the logic integrated circuit when the command signal and the reference signal are identical to each other; third program code means, when the command signal and the reference signal are not identical to each other, for inputting at least a first code composed of a plurality of first data bits and a second code composed of a plurality of first data bits, the first and second codes having been coded by a coding method; fourth program code means for arranging the first and the second data bits in order that at least a bit of an N-order of the first data bits and a bit of the N-order of the second data bits are stored in one of the cells, the N being an integral number; generating a plurality of voltages corresponding to the arranged data bits; and applying the voltages to cells among the plurality of multilevel memory cells in response to address information corresponding to the cells.

A code processing method may be used for a semiconductor device having a logic-rewritable logic circuit with a logic security function and having a plurality of multilevel memory cells storing at least three levels of data each. The method may comprise the steps of: supplying a code processing program to the control device; outputting a command signal corresponding to the program from the control device; applying the command signal to the logic circuit to rewriting logic thereof in accordance with the program; applying the program to at least either data or an address related to the data on the basis of the rewritten logic; and storing the data in a memory device, wherein the logic rewriting step includes the steps of: comparing a first data related to a first logical state indicating a present state of the logic circuit with a second data related to a second logical state of the logic circuit included in the command signal; prohibiting rewriting of the logic of the logic circuit from the first to the second logical state when the first and the second data are not identical to each other; when the first and the second data are identical to each other, inputting at least a first code composed of a plurality of first data bits and a second code composed of a plurality of first data bits, the first and second codes having been coded by a coding method; fourth program code means for arranging the first and the second data bits in order that at least a bit of an N-order of the first data bits and a bit of the N-order of the second data bits are stored in one of the cells, the N being an integral number; generating a plurality of voltages corresponding to the arranged data bits; and applying the voltages to cells among the plurality of multilevel memory cells in response to address information corresponding to the cells to rewrite the logic of the logic circuit from the first to the second logical state.

A code processing method may be used for a semiconductor device having a logic-rewritable logic circuit with a logic security function and having a plurality of multilevel memory cells storing at least three levels of data each. The method may comprise the steps of: supplying a code processing program to the control device; outputting a command signal corresponding to the program from the control device; applying the command signal to the logic circuit to rewriting logic thereof in accordance with the program; applying the program to at least either data or an address related to the data on the basis of the rewritten logic; and storing the data in a memory device, wherein the logic rewriting step includes the steps of: comparing the command signal with at least a reference signal; prohibiting rewriting of the logic of the logic circuit when the command signal and the reference signal are identical to each other; when the command signal and the reference signal are not identical to each other, inputting at least a first code composed of a plurality of first data bits and a second code composed of a plurality of first data bits, the first and second codes having been coded by a coding method; arranging the first and the second data bits in order that at least a bit of an N-order of the first data bits and a bit of the N-order of the second data bits are stored in one of the cells, the N being an integral number; generating a plurality of voltages corresponding to the arranged data bits; and applying the voltages to cells among the plurality of multilevel memory cells in response to address information corresponding to the cells to rewrite the logic of the logic circuit.

A computer readable medium may storage program code for causing a computer to apply a program for code processing of data of a semiconductor device with a security protection function having a logic integrated circuit capable of changing logic thereof in response to an external command signal, the logic integrated circuit having a plurality of multilevel memory cells storing at least three levels of data each, and a control device. The program may comprise: first program code means for supplying a code processing program to the control device; second program code means for outputting a command signal corresponding to the program from the control device; third program code means for applying the command signal to the logic circuit to rewriting logic thereof in accordance with the program; fourth program code means for applying the program to at least either data or an address related to the data on the basis of the rewritten logic; and fifth program code means for storing the data in a memory device, wherein the third program code means includes: sixth program code means for comparing a first data related to a first logical state indicating a present state of the logic circuit with a second data related to a second logical state of the logic circuit included in the command signal; seventh program code means for prohibiting rewriting of the logic of the logic circuit from the first to the second logical state when the first and the second data are not identical to each other; eighth program code means for, when the first and the second data are identical to each other, inputting at least a first code composed of a plurality of first data bits and a second code composed of a plurality of first data bits, the first and second codes having been coded by a coding method; ninth program code means for arranging the first and the second data bits in order that at least a bit of an N-order of the first data bits and a bit of the N-order of the second data bits are stored in one of the cells, the N being an integral number; tenth program code means for generating a plurality of voltages corresponding to the arranged data bits; and eleventh program code means for applying the voltages to cells among the plurality of multilevel memory cells in response to address information corresponding to the cells to rewrite the logic of the logic circuit from the first to the second logical state.

A computer readable medium may storage program code for causing a computer to apply a program for code processing of data of a semiconductor device with a security protection function having a logic integrated circuit capable of changing logic thereof in response to an external command signal, the logic integrated circuit having a plurality of multilevel memory cells storing at least three levels of data each, and a control device. The program may comprise: first program code means for supplying a code processing program to the control device; second program code means for outputting a command signal corresponding to the program from the control device; third program code means for applying the command signal to the logic circuit to rewriting logic thereof in accordance with the program; fourth program code means for applying the program to at least either data or an address related to the data on the basis of the rewritten logic; fifth program code means for storing the data in a memory device, wherein the third program code means includes: sixth program code means for comparing the command signal with at least a reference signal; seventh program code means for prohibiting rewriting of the logic of the logic circuit when the command signal and the reference signal are identical to each other; eighth program code means for, when the command signal and the reference signal are not identical to each other, inputting at least a first code composed of a plurality of first data bits and a second code composed of a plurality of first data bits, the first and second codes having been coded by a coding method; ninth program code means for arranging the first and the second data bits in order that at least a bit of an N-order of the first data bits and a bit of the N-order of the second data bits are stored in one of the cells, the N being an integral number; tenth program code means for generating a plurality of voltages corresponding to the arranged data bits; and eleventh program code means for applying the voltages to cells among the plurality of multilevel memory cells in response to address information corresponding to the cells to rewrite the logic of the logic circuit.

BRIEF DESCRIPTION OF THE DRAWINGS

FIG. 1 is a block diagram showing an embodiment of the semiconductor device applied to a logic integrated circuit according to the present invention;

FIG. 2 is a circuit diagram of a programmable interconnect array of the logic integrated circuit;

FIG. 4 is a block diagram showing a rewrite control circuit of the logic integrated circuit;

FIG. 5 is a flowchart showing an example of a processing program executed by the rewrite control circuit;

FIG. 6 is a flowchart showing another example of the processing program executed by the rewrite control circuit;

FIG. 7 is a sectional view of structure of an EEPROM memory cell;

FIG. 8 explains a method of writing data to the EEPROM memory cell;

FIGS. 12A and 12B explain modifications of the method of writing data to the EEPROM memory cell shown in FIG. 11;

FIG. 14 is another block diagram showing a rewrite control circuit of the logic integrated circuit;

FIG. 15 is a flowchart showing an example of a processing program executed by the rewrite control circuit shown in FIG. 14;

FIG. 16 is a block diagram showing another embodiment of the semiconductor device according to the present invention;

FIG. 17 is a flowchart showing an example of the deciphering operation of the semiconductor device shown in FIG. 16;

FIG. 18 is a flowchart showing an example of the ciphering operation of the semiconductor device shown in FIG. 16;

FIG. 19 is a block diagram showing still another embodiment of the semiconductor device according to the present invention;

FIG. 21 is a flowchart showing an example of the ciphering operation of the semiconductor device shown in FIG. 19.

DETAILED DESCRIPTION OF THE PREFERRED EMBODIMENTS

Preferred embodiments according to the present invention will be described hereinbelow with reference to the attached drawings.

As shown in FIG. 1, a semiconductor device according to the present invention includes a logic integrated circuit 100 with a logic protection function. The circuit 100 is a logic rewritable logic integrated circuit of EEPROM type and provided with a programmable interconnect array (PIA) 101, macrocells $102_1$ to $102_n$ connected to the PIA 101, I/O circuits $104_1$ to $104_n$ connected to the corresponding macrocells and a rewrite control circuit 103 for controlling rewriting of the PIA 101.

The macrocells $102_1$ to $102_n$ are equipped with standard logic computation libraries such as counter, AND, latch functions and capable of connected to each other at high speed or by a predetermined delay by means of the PIA 101. The PIA 101 is constructed by a global bus to connect the macrocells $102_1$ to $102_n$ to each other by control of the rewrite control circuit 103.

In detail, the PIA 101 is provided with, as shown in FIG. 2, a bus line 201 of an m number of signal lines 0 to m and an input section $200_{xin}$ and an output section $200_{xout}$. The input and output sections $200_{xin}$ and $^{200}_{xout}$ are provided so as to correspond to a macro cell $102_x$ among the macrocells $102_1$ to $102_n$. In other words, the input and output sections correspond to each macro cell.

The input section $200_{xin}$ is provided with EEPROM memory cells $202_{xo}$ to $202_{xm}$ corresponding to the signal lines 0 to m, AND circuits $203_{xo}$ to $203_{xm}$ connected to the corresponding EEPROM memory cells $202_{xo}$ to $202_{xm}$ and an OR circuit $204_x$ connected to the AND circuits $203_{xo}$ to $203_{xm}$. The OR circuit $204_x$ outputs a signal to the macro cell $102_x$.

Figure 3:
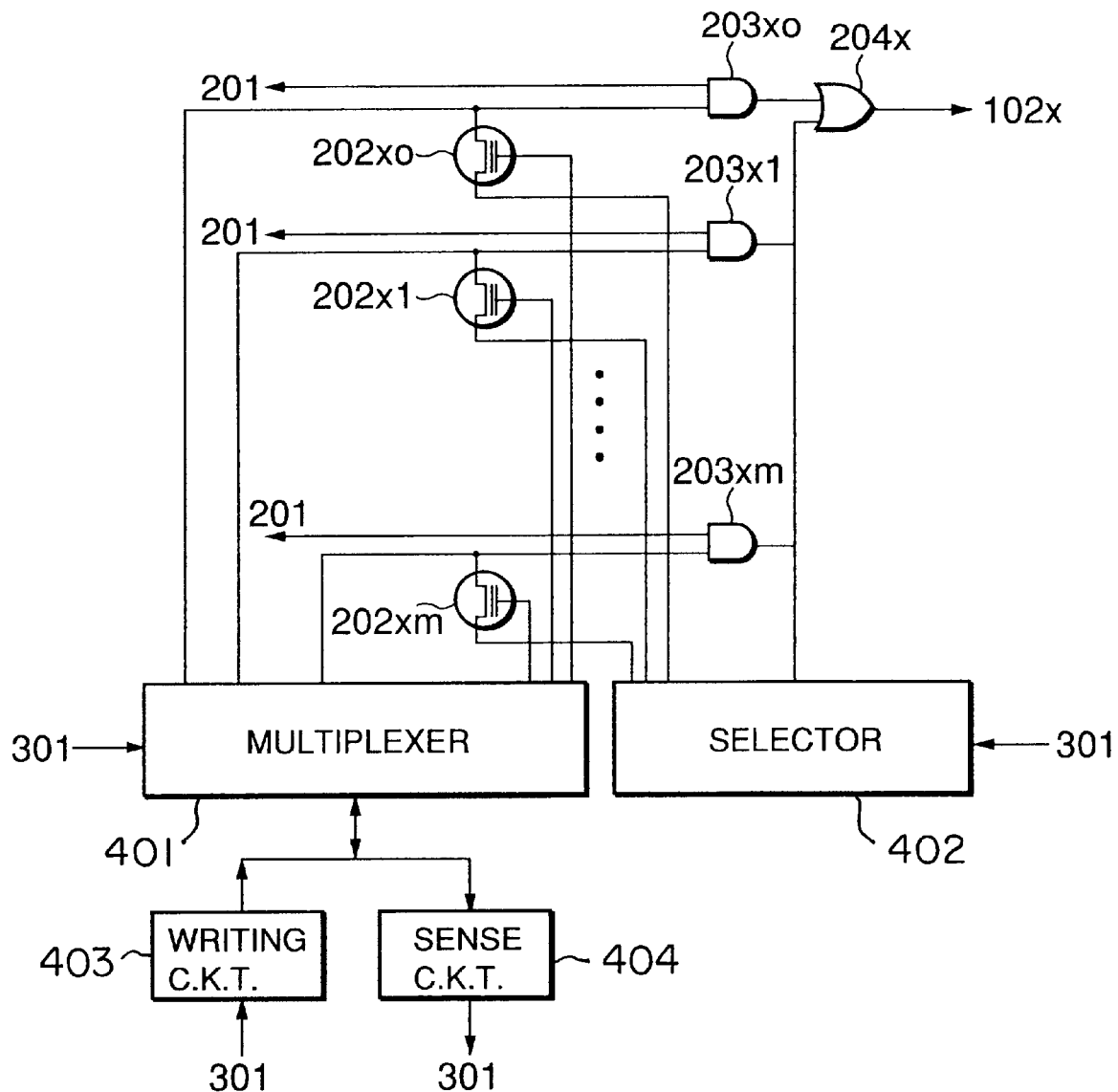
FIG. 3 is another circuit diagram of a programmable interconnect array of the logic integrated circuit.

On the other hand, the output section $200_{xout}$ is provided with EEPROM memory cells $205_{xo}$, $205_{x1}$, . . . , AND circuits $206_{xo}$ to $206_{x1}$, . . . , connected to the macro cell $102_x$ and an OR circuit $207_x$ connected to the AND circuits $203_{xo}$ to $203_{x1}$, . . . The OR circuit $207_x$ outputs a signal to the line 0. Further, as shown in FIG. 3, the memory cells $202_{xo}$ to $202_{xm}$ are connected to a multiplexer 401, a selector 402. The multiplexer 301 is connected to a writing circuit 403 and a sense circuit 404. Further, these circuits 401 to 404 are connected to a control circuit 301 included in the rewrite control circuit 103. Not shown in FIG. 3 for brevity, the memory cells $205_{xo}$ to $205_{xm}$ are also connected to these circuits.

In FIG. 3, the memory cells $202_{xo}$ to $202_{xm}$ controls an input of the AND circuits $203_{xo}$ to $203_{xm}$ according to their memory states to control the macro cell $102_x$ and another macrocells. In detail, when a threshold voltage (value) of the memory cells $202_{xo}$ is for example "Low", a signal of "Low" is input to the AND circuit $203_{xo}$, so that data on the bus line cannot be output to the macro cell $102_x$. On the other hand, if "High", there is an output to the macro cell $102_x$.

Accordingly, connection between the macro cell $102_x$ and the others can be controlled by rewriting the threshold values of the memory cells $202_{xo}$ to $202_{xm}$.

As described above, interconnection among the macro cells $102_1$ to $202_n$ can be controlled by the memory states of the corresponding EEPROM memory cells $202_{xo}$ to $202_{xm}$. In other words, interconnection among the macro cells $102_1$ to $202_n$ can be changed by rewriting the memory states of the memory cells $202_{xo}$ to $202_{xm}$, thus attaining another logic integrated circuit of logic functions different from those of the logic integrated circuit 100.

Rewriting the memory states of the memory cells $202_{xo}$ to $202_{xm}$, or rewriting the PIA 101 is done by the rewrite control circuit 103. To the rewrite control circuit 103, a command signal is supplied from an external circuit (not shown) through a input signal line 105. When the command signal indicates a rewrite command, the PIA 101 is rewritten according to the rewrite command.

Suppose that an unauthorized rewrite command signal (virus) is supplied to the rewrite control circuit 103 in order to destroy a logic of the logic integrated circuit 100.

For protection of the logic of the logic integrated circuit 100, the semiconductor devise of the first embodiment has the following function.

As shown in FIG. 4, the rewrite control circuit 103 is provided with the control circuit 301 to which a command signal is supplied through the signal line 105, a program memory 302 that stores control programs for the control circuit 301, a memory 304 (EEPROM) that stores memory states of the PIA 101 and a timer 303 in which a predetermined period of time is set.

Control programs according to flow charts shown in FIGS. 5 and 6 are pre-stored in the program memory 302. In operation, either one of the control programs is read and executed by the control circuit 301.

In the first embodiment, the control program according to flow chart of FIG. 5 is executed.

In FIG. 5, the control circuit 301 detects a threshold values, for example, "High" from the EEPROM memory cells $202_{xo}$ to $202_{xm}$ via the sense circuit 404 and stores the number of the EEPROM memory cells (the number of gates) with the threshold value "High" as a first cipher key (a first data) in the memory 304 in STEP S400.

Next, in STEP S410, the control circuit 301 determines whether an external command signal is supplied thereto through the signal line 105. When a command signal is supplied to the control circuit 301, the process goes to STEP S420, if not, to STEP S410 to repeat the command signal determination step.

The control circuit 301 accepts the command signal in STEP S420 and compares the number of the EEPROM memory cells (the number of gates) with the threshold value "High" stored in the memory 304 as the first cipher key with another number of the EEPROM memory cells (the number of gates) set by a user or a third party in the command signal as a second cipher key (a second data) in STEP S430.

When the first and second cipher keys are different from each other, the control circuit 301 judges that the command signal is invalid and prohibits rewriting of the logic of the logic integrated circuit 100 in STEP S450. The process then returns to STEP S410.

On the other hand, when the first and second cipher keys are identical to each other, the control circuit 301 judges that the command signal is valid and, under the command signal, identifies and rewrites memory cells to be rewritten via the selector 402 and writing circuit 403 in STEP S440. The process then returns to STEP S410.

As described, according to the first embodiment, the number of EEPROM memory cells (the number of gates) with the threshold values "High" at present in the PIA 101 is compared as the first cipher key with the other number of EEPROM memory cells as the second cipher key set in a rewrite command signal by a user or a third party; an examination is made to determine whether the first and second cipher keys are identical to each other; and if not, rewriting of PIA 101, or the logic of the logic integrated circuit 100 is prohibited.

Accordingly, the exact number of EEPROM memory cells with the threshold values "High" at present is essential information for the user or the third party to rewrite the PIA 101. And, the present number of memory cells is known only to the user who knows the present logic of the logic-rewritable logic integrated circuit 100, hence there is no possibility of rewriting the logic integrated circuit 100 by the third party.

Next, a second embodiment according to the present invention will be described.

The difference between the first and second embodiments is that: in the former, rewriting of the logic of the logic integrated circuit 100 is allowed when the result of cipher key inspection is "identical to each other", if not, rewriting is prohibited to make possible rewriting by a user and to protect the logic integrated circuit 100 from unauthorized rewriting by a third party; on the other hand, in the latter, for example, in the case where a user has not rewritten the logic integrated circuit 100 for a certain period of time, cipher key inspection is conducted after rewriting and if the result is "not identical to each other", a warning is issued to the user against use of the logic integrated circuit 100.

The rewrite control circuit 103 in third embodiment operates under the control program according to the flow chart shown in FIG. 6.

In FIG. 6, the control circuit 301 preset the timer 303 at a predetermined period of time in STEP S401. Then, the control circuit 301 detects a threshold values, for example, "High" from the EEPROM memory cells $202_{xo}$ to $202_{xm}$ via the multiplexer 401 and the sense circuit 404 and stores the number of the EEPROM memory cells (the number of gates) with the threshold value "High" as a first cipher key (a first data) in the memory 304 in STEP S402.

Next, in STEP S403, the control circuit 301 determines whether an external command signal is supplied thereto through the signal line 105. When a command signal is supplied to the control circuit 301, the process goes to STEP S404, if not, to STEP S406.

The control circuit 301 accepts the command signal in STEP S404 and, under the command signal, identifies and rewrites memory cells to be rewritten via the selector 402 and writing circuit 403 in STEP S405. Then, the process goes to STEP S406.

In STEP S406, the control circuit 301 determines whether the timer 303's time is up, if not, the process returns to STEP S403 to repeat the following steps.

When the timer 303's time is up, in STEP S407, the control circuit 301 compares the memory status of the PIA 101 as the cipher key stored in the memory 304 with the present memory state of the PIA 101, or the present number of the EEPROM memory cells with the threshold value "High" (a second data).

When the memory state of the PIA 101 stored in the memory 304 and the present memory status of the PIA 101 are different from each other, in STEP S409, the control circuit 301 judges that the logic of logic integrated circuit 100 has been rewritten (without authorization) to issue a warning signal. Then, the process ends. With this warning signal, the user can recognize that the logic of logic integrated circuit 100 has been rewritten (without authorization).

On the other hand, in STEP S407, when the memory status of the PIA 101 stored in the memory 304 and the present memory state of the PIA 101 are identical to each other, the control circuit 301 judges that the logic of logic integrated circuit 100 has not been rewritten, the control circuit 301 resets the timer 303 in STEP S408. Then, the process repeats the following steps.

As described above, according to the second embodiment, the number of EEPROM memory cells with the threshold values "High" in the PIA 101 is used as a cipher key to periodically inspect whether the set number and the present number are identical to each other. And, if not, it is judged that the logic of the logic integrated circuit 100 has been rewritten and a warning is issued so as not to use the logic integrated circuit 100.

Accordingly, the periodical logic inspection can protect a careless use of the logic integrated circuit 100 which has been rewritten, for example, without authorization.

When the user wants to rewrite the logic of the logic integrated circuit 100, as described in the first embodiment, the control program according to the flow chart of FIG. 5 which is pre-stored in the program memory 302 is read and executed by the control circuit 301.

In the first and second embodiments, the number of EEPROM memory cells with the threshold values "High" is used as a cipher key. However, not limited to this, the number of EEPROM memory cells with the threshold values "Low" can be used as a cipher key. Or, a code obtained by compressing a signal indicating the number of EEPROM memory cells with the threshold values "High" or "Low" can be used as a cipher key. Furthermore, the latest date on which the logic was rewritten or the number of macro cells which have not been used for constituting a logic at the latest moment where the logic was rewritten can be used as a cipher key.

Further, in the second embodiment, addresses of the EEPROM memory cells with the threshold values "High" or "Low" can be stored as a cipher key in a look-up table of the memory 304.

In this case, in STEP S405 of the flow chart shown in FIG. 6, addresses of the EEPROM memory cells whose threshold values "High" or "Low" have been rewritten are read by the control circuit 301 of FIG. 4 via the sense circuit 404 of FIG. 3. Then, in STEP S407, comparison is made between the addresses as the cipher key and the present addresses after rewriting. If they are different from each other, judgement is made that the threshold values "High" or "Low" are rewritten to issue a warning signal.

Moreover, in this case, the addresses stored in the look-up table of the memory 304 can be referred to after the rewriting, to identify memory cells via the sense circuit 402 to recover the logic before rewriting. It is also preferable to compress a signal indicating the addresses to obtain a code as a cipher key.

Furthermore, a record of the cipher keys described above can be stored in a look-up table inside or outside the logic integrated circuit 100 which is hard to be known by a third party. A cipher key can be periodically changed with reference to the record to strengthen security protection against unauthorized rewriting.

Further, in the first and second embodiments, multilevel memories can be used for constituting the EEPROM memory cells $202_{xo}$ to $202_{xm}$. This makes the combination of "High" and "Low" of the memory cells be complicated and such combination can be used as a cipher key to further strengthen security protection against unauthorized rewriting.

Described below is the first embodiment of a method of writing the threshold values "High" or "Low" in the case where the multilevel memories are used for constituting the EEPROM memory cells $202_{xo}$ to $202_{xm}$.

The multilevel memory is provided with a control gate and a charge accumulating layer capable of storing one of at least three different levels of memory status.

FIG. 7 shows a sectional view of an EEPROM (flash EEPROM) cell of the multilevel memory. The multilevel memory includes a plurality of such flash EEPROM cells.

As shown in FIG. 7, the memory cell 900 corresponding to each of the memory cells $202_{xo}, \ldots 202_{xm}$ shown in FIG. 2 has the following structure:

A drain region 902 and a source region 903 with n type impurity diffused are formed in the surface part of a p-type substrate 901. The region 904 between the source and drain is used as a channel region. A tunnel insulating film 905 of $SiO_2$ having a thickness of approximately 10 nm is formed on the channel region 904, and a stacked structure having a floating gate 913 of a low resistance polysilicon, an interlayer insulating film 906 and a control gate is formed on the channel region 904. A bit line 911 is connected to the drain 912 and a source line 912 is connected to the source 903.

An operation for writing four-value data "00" to "11" in an objective memory cell will be described. Here, the values "1" and "0" correspond to "High" and "Low" in the first and second embodiments.

In the case where a data "11" is written, a bit line 911 selected by the selector 402 of FIG. 3 is grounded, the source line 912 is opened and a pulse voltage having 10 through 15V is applied by the writing circuit 403 via the multiplexer 401 of FIG. 3 to a selected control gate (word line). As a result, a voltage is induced in the floating gate 913 of the objective cell, then charges are injected in the polysilicon by well known Fowler-Nordheim tunneling mechanism in response to voltage difference between the floating gate 913 and the drain 902. By theses operation, a threshold value of the objective cell will increase approximately 7V, and such status is defined as "11" status.

During the operation, by applying approximately 3 V for bit lines of other cells, since the Fowler-Nordheim tunneling of electrons will not occur in the other cell, no data will be written.

Similarly, in the case where a data "10" is written in the objective cell, the selected bit line 911 is grounded, the source line 912 is opened and a pulse voltage having approximately 1V is applied to a selected control gate (word line). As a result, a threshold value of the objective cell will increase approximately 5V, and such status is defined as "10" status.

Similarly, in the case where a data "01" is written in the objective cell, the selected bit line 911 is grounded, the source line 912 is opened and a pulse voltage having approximately 2V is applied to a selected control gate (word line). As a result, a threshold value of the objective cell will increase approximately 3V, and such status is defined as "01" status.

Similarly, in the case where a data "00" is written in the objective cell, the selected bit line 911 is grounded, the source line 912 is opened and a pulse voltage having approximately 3V is applied to a selected control gate (word line). As a result, a threshold value of the objective cell will increase approximately 1V, and such status is defined as "01" status in which almost there has been no change from the initial threshold value (erase level).

As the writing circuit 403 shown in FIG. 3, a program circuit described in Japanese Patent Laid-Open No. 6(1994)-195987 can be used for the rewriting operation as described above.

Described below is the second method of writing the threshold values "High" or "Low" in the case where the multilevel memories are used for constituting the EEPROM memory cells $202_{xo}$ to $202_{xm}$.

The multilevel EEPROM described in this embodiment is a four-level memory device, in which the threshold voltage of each memory cell is set to any of the four values (0V, 2V, 4V, 6V) corresponding to each of two-bit data (00, 01, 10, 11) to be stored. Employed in this EEPROM is the method of interleaving, by m-times, a code C having a code length n and a burst error correction capability L, as the burst error correction code.

In data rewriting, whenever 8-bit data are input from the control circuit 301 of FIG. 4, the writing circuit 403 divides the input data into 4×2 data bits as (m11, m21, m31, m41) and (m12, m22, m32, m42) and forms 3×2 check bits (p11, p21, p31) and (p12, p22, p32).

Further, on the basis of these data bits (m11, m21, m31, m41) and (m12, m22, m32, m42) and the check bits (p11, p21, p31) (p12, p22, p32), two code words (m11, m21, m31, m41, p11, p21, p31) and (m12, m22, m32, m42, p12, p22, p32) are formed.

The two code words formed as described above are given to a bit data separator (not shown) of the writing circuit 403, and then the bits of the code words are put in the positions of 2×7 arrangement as shown in FIG. 8. Further, combinations of (m11, m12), (m21, m22), (m31, m32), (m41, m42), (p11, p12), (p21, p22) and (p31, p32) are sequentially stored in the seven memory cells.

The rearranged input data are supplied to a voltage generation and control circuit (not shown) of the writing circuit 403 to generate voltages according to the data bits. The generated voltages are supplied to the memory cells $202_{x0}$ to $202_{xm}$ via the multiplexer 401, thus threshold value being set on each memory cell.

Accordingly, in FIG. 8, m11 and m12 are stored in the memory cell 1 as the high- and the low-order bit, respectively. In the same way, m21 and m22; m31 and m32; m41 and m42; p11 and p12; p21 and p22; and p31 and p32 are stored in the memory cells 2 to 7, respectively.

As described later in further detail, each code word can be corrected even if a single error occurs. For instance, as shown in FIG. 8, even if the threshold voltage of the third memory cell 3 changes and thereby a burst error of two-bit length occurs, since this error is a single error in a single code word, the correction is enabled. In other words, even if the threshold voltage of one of the seven memory cells changes; that is, even when a burst error such that the stored contents "01" change to "10" occurs, for instance, the correction is enabled.

The third embodiment of the method of data writing according to the present invention will be described hereinbelow.

The semiconductor device applied with the second embodiment is an eight-level memory device, in which the threshold voltage of each memory cell is set to any of eight levels (0V, 1V, 2V, 3V, 4V, 5V, 6V, 7V) corresponding to three-bit data (000, 001, 010, 011, 100, 101, 110, 111) to be stored.

In data rewriting, whenever 12-bit data is input, the input data is divided into 4×3 data bits (m11, m21, m31, m41), (m12, m22, m32, m42) and (m13, m23, m33, m43). On the basis of the divided data bits, 3×3 redundant check bits (p11, p21, p31), (p12, p22, p32) and (p13, p23, p33) are obtained.

On the basis of these data bits and check bits, three code words (m11, m21, m31, m41, p11, p21, p31), (m12, m22, m32, m42, p12, p22, p32) and (m13, m23, m33, m43, p13, p23, p33) are formed in 3×7 arrangement. Further, as shown in FIG. 9, (m11, m12, m13), (m21, m22, m23), (m31, m32, m33), (m41, m42, m43), (p11, p12, p13), (p21, p22, p23) and (p31, p32, p33) are stored in the seven memory cells.

Figure 9:
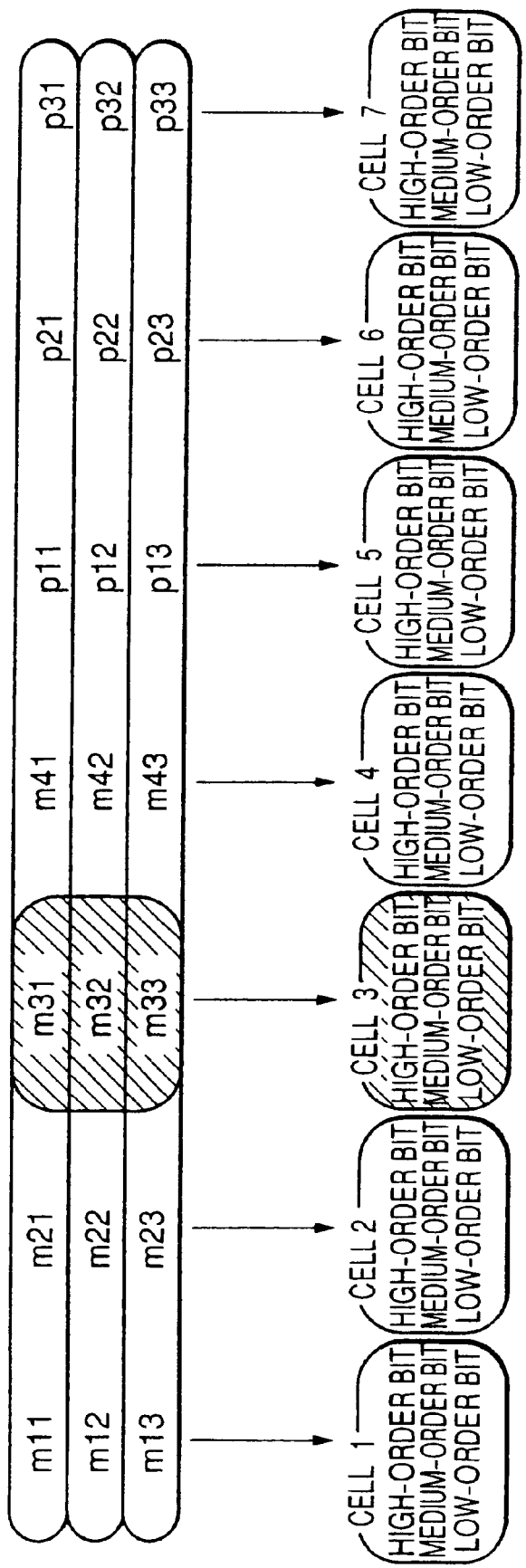
FIG. 9 explains another method of writing data to the EEPROM memory cell.

Accordingly, in FIG. 9, m11, m12 and m13 are stored in the memory cell 1 as the high-, the medium- and the low-order bit, respectively. In the same way, m21, m22 and m23; m31, m32 and m33; m41, m42 and m43; p11, p12 and p13; p21, p22 and p23; and p31, p32 and p33 are stored in the memory cells 2 to 7, respectively.

Each code word can be corrected even if a single error occurs. For instance, as shown in FIG. 9, even if the threshold voltage of the third memory cell 3 changes and thereby a burst error of three-bit length occurs, since this error is a single error in a single code word, the correction is enabled. In other words, even if the threshold voltage of one of the seven memory cells changes; that is, even when a burst error such that the stored contents "100" change to "011" occurs, for instance, the correction is enabled.

Two modifications of the third embodiment of the method of data writing according to the present invention will be described hereinbelow.

The semiconductor device applied with the first modification is an eight-level memory device, in which the threshold voltage of each memory cell is set to any of eight levels (0V, 1V, 2V, 3V, 4V, 5V, 6V, 7V) corresponding to three-bit data (000, 001, 010, 011, 100, 101, 110, 111) to be stored. The first modification follows a specific linear coding standard in which two errors per bit of a code word can be corrected.

In data rewriting, whenever data composed of a specific number of bits, for example, K bits are input, the input data are divided into three (K/3) data bits. Redundant bits are obtained on the basis of the divided data bits to form a 14-bit code word (m11, m21, m31, m41, m51, m61, m71, m12, m22, m32, m42, m52, m62, m72) and a 7-bit code word (m13, m23, m33, m43, m53, m63, m73). In each code word, a specific number of bits are data bits and the remaining bits are redundant bits for error correction.

Then, the 14-bit code word (m11, m21, m31, m41, m51, m61, m71, m12, m22, m32, m42, m52, m62, m72) is divided into 7-bit code trains (m11, m21, m31, m41, m51, m61, m71) and (m12, m22, m32, m42, m52, m62, m72).

Then, the code train a (m11, m21, m31, m41, m51, m61, m71), the code train b (m12, m22, m32, m42, m52, m62, m72) and one code word c (m13, m23, m33, m43, m53, m63, m73) are put in the positions of 3×7 arrangement. Further, as shown in FIG. 5A, (m11, m12, m13), (m21, m22, m23), (m31, m32, m33), (m41, m42, m43), (m51, m52, m53), (m61, m62, m63) and (m71, m72, m73) are stored in the seven memory cells.

Figure 10A:
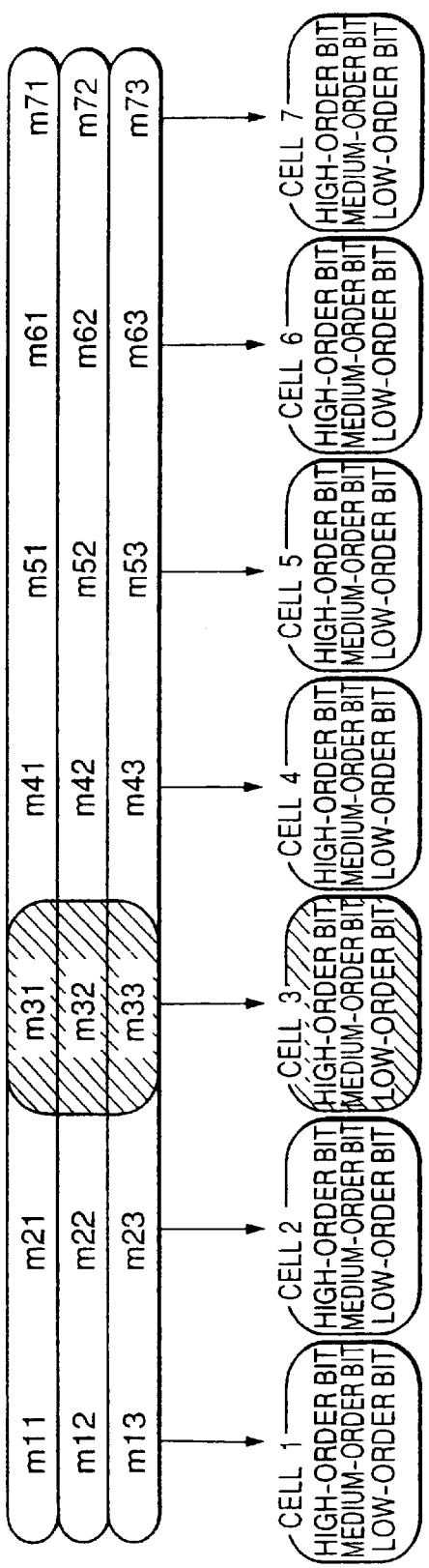
FIGS. 10A and 10B explain modifications of the method of writing data to the EEPROM memory cell shown in FIG. 9.

Accordingly, in FIG. 10A, m11, m12 and m13 are stored in the memory cell 1 as the high-, the medium- and the low-order bit, respectively. In the same way, m21, m22 and m23; m31, m32 and m33; m41, m42 and m43; m51, m52 and m53; m61, m62 and m63; and m71, m72 and m73 are stored in the memory cells 2 to 7, respectively.

The code trains a and b, and the code word c can be corrected even if a single error occurs. For instance, as shown in FIG. 10A, even if a burst error of three-bit length occurs in the third memory cell 3, since this error is a single error in the code trains a and b, and the code word c, and this error corresponds to two errors in the code word composed of the code trains a and b, the correction is enabled. In other words, even if the threshold voltage of one of the seven memory cells changes; that is, even when a burst error such that the stored contents "100" change to "011" occurs, for instance, the correction is enabled.

Next, the second modification of the second embodiment of the method of data writing according to the present invention will be described hereinbelow.

The semiconductor device applied with the second modification is an eight-level memory device, in which the threshold voltage of each memory cell is set to any of eight levels (0V, 1V, 2V, 3V, 4V, 5V, 6V, 7V) corresponding to three-bit data (000, 001, 010, 011, 100, 101, 110, 111) to be stored. The second modification follows a specific coding standard in which a single error per bit of a code word can be corrected and two errors per bit of a code word can be detected.

In data rewriting, whenever 12-bit data is input, the input data is divided into 4×3 data bits (m11, m21, m31, m41), (m12, m22, m32, m42) and (m13, m23, m33, m43). By means of Hamming codes, 3×3 redundant bits (p11, p21, p31), (p12, p22, p32) and (p13, p23, p33) are obtained on the basis of the divided data bits.

Then, all the seven bits are EX-ORed in each of the three code trains (m11, m21, m31, m41, p11, p21, p31), (m12, m22, m32, m42, p12, p22, p32) and (m13, m23, m33, m43, p13, p23, p33). The resultant redundant bits q1, q2, and q3 are added to the three code trains, respectively, to form three code words (m11, m21, m31, m41, p11, p21, p31, q1), (m12, m22, m32, m42, p12, p22, p32, q2) and (m13, m23, m33, m43, p13, p23, p33, q3).

Then, the three code words are put in the positions of 3×8 arrangement. Further, as shown in FIG. 10B, (m11, m12, m13), (m21, m22, m23), (m31, m32, m33), (m41, m42, m43), (p11, p12, p13), (p21, p22, p23), (p31, p32, p33) and (q1, q2, q3) are stored in the eight memory cells.

Figure 10B:
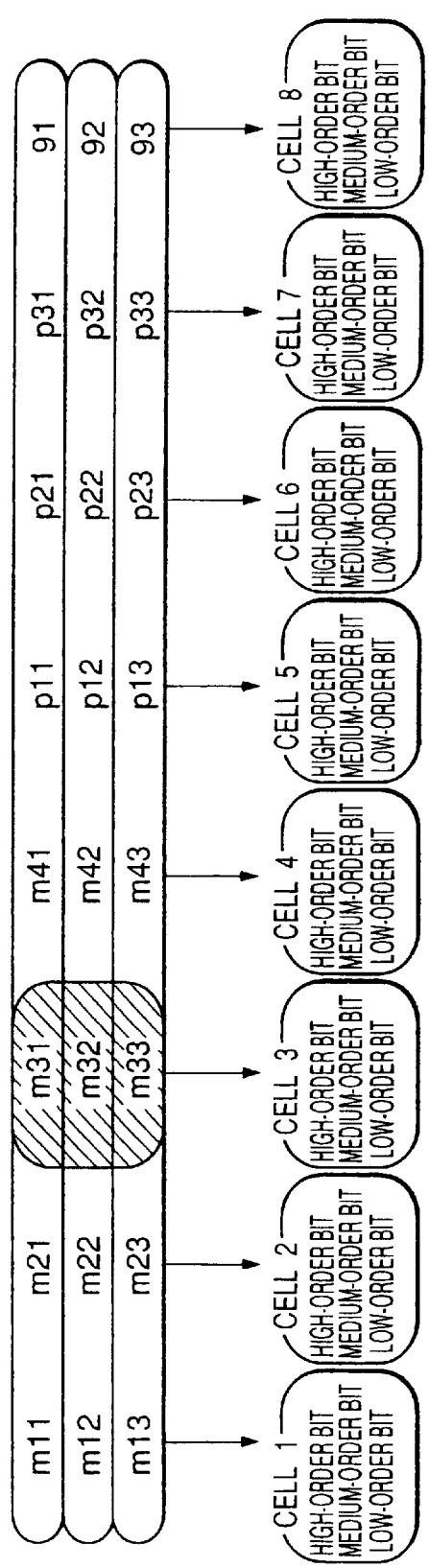

Accordingly, in FIG. 10B, m11, m12 and m13 are stored in the memory cell 1 as the high-, the medium- and the low-order bit, respectively. In the same way, m21, m22 and m23; m31, m32 and m33; m41, m42 and m43; p11, p12 and p13; p21, p22 and p23; p31, p32 and p33; and q1, q2 and q3 are stored in the memory cells 2 to 8, respectively.

Each code word can be corrected even if a single error occurs. For instance, as shown in FIG. 10B, even if a burst error of three-bit length occurs in the third memory cell 3, since this error is a single error in each code word, the correction is enabled. In other words, even if the threshold voltage of one of the eight memory cells changes; that is, even when a burst error such that the stored contents "100" change to "011" occurs, for instance, the correction is enabled. Further, if a burst error of one to three-bit length occurs in another memory cell, there are two errors in at least one code word. These two errors can be detected and one of them can be corrected.

The fourth embodiment of the method of data writing according to the present invention will be described hereinbelow.

The semiconductor device applied with the third embodiment is a sixteen-level memory device, in which the threshold voltage of each memory cell is set to any of sixteen levels (0V, 1V, 1.25V, 1.5V, 1.75V, 2V, 2.25V, 2.5V, 2.75V, 3V, 3.25V, 3.5V, 3.75V, 4V, 4.25V, 4.5V) corresponding to four-bit data (0000, 0001, 0010, 0011, 0100, 0101, 0110, 0111, 1000, 1001, 1010, 1011, 1100, 1101, 1110, 1111) to be stored.

In data rewriting, whenever 16-bit data is input, the input data is divided into 4×4 data bits (m11, m21, m31, m41), (m12, m22, m32, m42), (m13, m23, m33, m43) and (m14, m24, m34, m44). On the basis of the divided data bits, 3×4 redundant bits (p11, p21, p31), (p12, p22, p32), (p13, p23, p33) and (p14, p24, p34) are obtained.

On the basis of these data bits and redundant bits, four code words (m11, m21, m31, m41, p11, p21, p31), (m12, m22, m32, m42, p12, p22, p32), (m13, m23, m33, m43, p13, p23, p33) and (m14, m24, m34, m44, p14, p24, p34) are formed and put in the positions of 4×7 arrangement. Further, as shown in FIG. 11, (m11, m12, m13, m14), (m21, m22, m23, m24), (m31, m32, m33, m34), (m41, m42, m43, m44), (p11, p12, p13, p14), (p21, p22, p23, p24) and (p31, p32, p33, p34) are stored in the seven memory cells.

Figure 11:
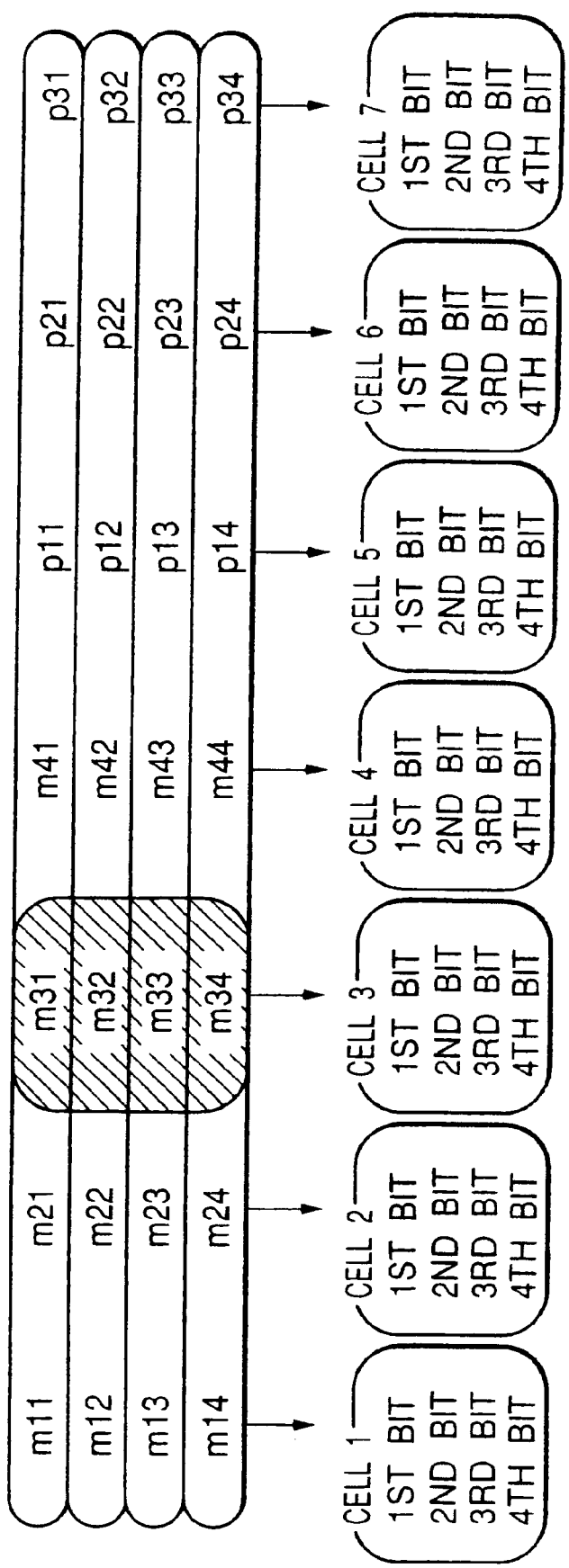
FIG. 11 explains still another method of writing data to the EEPROM memory cell.

Accordingly, in FIG. 11, m11, m12, m13 and m14 are stored in the memory cell 1 as the first, the second, the third and the fourth bit, respectively. In the same way, m21, m22, m23 and m24; m31, m32, m33 and m34; m41, m42, m43 and m44; p11, p12, p13 and p14; p21, p22, p23 and p24; and p31, p32, p33 and p34 are stored in the memory cells 2 to 7, respectively.

Each code word can be corrected even if a single error occurs. For instance, as shown in FIG. 11, even if a burst error of four-bit length occurs in the third memory cell 3, since this error is a single error in a single code word, the correction is enabled. In other words, even if the threshold voltage of one of the seven memory cells changes; that is, even when a burst error such that the stored contents "1000" change to "0111" occurs, for instance, the correction is enabled.

Two modifications of the fourth embodiment of the method of data writing according to the present invention will be described hereinbelow.

The semiconductor device applied with the first modification is a sixteen-level memory device, in which the threshold voltage of each memory cell is set to any of sixteen levels (0V, 1V, 1.25V, 1.5V, 1.75V, 2V, 2.25V, 2.5V, 2.75V, 3V, 3.25V, 3.5V, 3.75V, 4V, 4.25V, 4.5V) corresponding to four-bit data (0000, 0001, 0010, 0011, 0100, 0101, 0110, 0111, 1000, 1001, 1010, 1011, 1100, 1101, 1110, 1111) to be stored. The first modification follows a specific linear coding standard in which two errors per bit of a code word can be corrected.

In data rewriting, whenever data composed of a specific number of bits, for example, p bits is input, the input data is divided into four (p/3) data bits. Redundant bits are obtained on the basis of the divided data bits to form two 14-bit code words (m11, m21, m31, m41, m51, m61, m71, m12, m22, m32, m42, m52, m62, m72) and (m13, m23, m33, m43, m53, m63, m73, m14, m24, m34, m44, m54, m64, m74). In each code word, a specific number of bits are data bits and the remaining bits are redundant bits for error correction.

Then, these 14-bit code words are divided into 7-bit code trains (m11, m21, m31, m41, m51, m61, m71) and (m12, m22, m32, m42, m52, m62, m72), and (m13, m23, m33, m43, m53, m63, m73) and (m14, m24, m34, m44, m54, m64, m74), respectively.

Then, the code trains are put in the positions of 4×7 arrangement. Further, as shown in FIG. 12A, (m11, m12, m13, m14), (m21, m22, m23, m24), (m31, m32, m33, m34), (m41, m42, m43, m44), (m51, m52, m53, m54), (m61, m62, m63, m64) and (m71, m72, m73, m74) are stored in the seven memory cells.

Accordingly, in FIG. 12A, m11, m12, m13 and m14 are stored in the memory cell 1 as the first, the second, the third and the fourth bit, respectively. In the same way, m21, m22, m23 and m24; m31, m32, m33 and m34; m41, m42, m43 and m44; m51, m52, m53 and m54; m61, m62, m63 and m64; and m71, m72, m73 and m74 are stored in the memory cells 2 to 7, respectively.

Each code train can be corrected even if a single error occurs. For instance, as shown in FIG. 12A, even if a burst error of four-bit length occurs in the third memory cell 3, since this error is a single error in each code train, and this error corresponds to two errors in the code word composed of two of the code trains, the correction is enabled. In other words, even if the threshold voltage of one of the seven memory cells changes; that is, even when a burst error such that the stored contents "1000" change to "0111" occurs, for instance, the correction is enabled.

Next, the second modification of the third embodiment of the method of data writing according to the present invention will be described hereinbelow.

The semiconductor device applied with the second modification is a sixteen-level memory device, in which the threshold voltage of each memory cell is set to any of sixteen levels (0V, 1V, 1.25V, 1.5V, 1.75V, 2V, 2.25V, 2.5V, 2.75V, 3V, 3.25V, 3.5V, 3.75V, 4V, 4.25V, 4.5V) corresponding to four-bit data (0000, 0001, 0010, 0011, 0100, 0101, 0110, 0111, 1000, 1001, 1010, 1011, 1100, 1101, 1110, 1111) to be stored. The second modification follows a specific coding standard in which a single error per bit of a code word can be corrected and two errors per bit of a code word can be detected.

In data rewriting, whenever 16-bit data is input, the input data is divided into 4×4 data bits (m11, m21, m31, m41), (m12, m22, m32, m42), (m13, m23, m33, m43) and (m14, m24, m34, m44). By means of Hamming codes, 3×4 redundant bits (p1, p21, p31), (p12, p22, p32), (p13, p23, p33) and (p14, p24, p34) are obtained on the basis of the divided data bits.

Then, all the seven bits are EX-ORed in each of the four code trains (m11, m21, m31, m41, p11, p21, p31), (m12, m22, m32, m42, p12, p22, p32), (m13, m23, m33, m43, p13, p23, p33) and (m14, m24, m34, m44, p14, p24, p34). The resultant redundant bits q1, q2, q3 and q4 are added to the four code trains, respectively, to form four code words (m11, m21, m31, m41, p11, p21, p31, q1), (m12, m22, m32, m42, p12, p22, p32, q2), (m13, m23, m33, m43, p13, p23, p33, q3) and (m14, m24, m34, m44, p14, p24, p34, q4).

Then, the four code words are put in the positions of 4×8 arrangement. Further, as shown in FIG. 12B, (m11, m12, m13, m14), (m21, m22, m23, m24), (m31, m32, m33, m34), (m41, m42, m43, m44), (p11, p12, p13, p14), (p21, p22, p23, p24), (p31, p32, p33, p34) and (q1, q2, q3, q4) are stored in the eight memory cells.

Accordingly, in FIG. 12B, m11, m12, m13 and m14 are stored in the memory cell 1 as the first, the second, the third and the fourth bit, respectively. In the same way, m21, m22, m23 and m24; m31, m32, m33 and m34; m41, m42, m43 and m44; p11, p12, p13 and p14; p21, p22, p23 and p24; p31, p32, p33 and p34; and q1, q2, q3 and q4 are stored in the memory cells 2 to 8, respectively.

Each code word can be corrected even if a single error occurs. For instance, as shown in FIG. 12B, even if a burst error of four-bit length occurs in the third memory cell 3, since this error is a single error in each code word, the correction is enabled. In other words, even if the threshold voltage of one of the eight memory cells changes; that is, even when a burst error such that the stored contents "1000" change to "0111" occurs, for instance, the correction is enabled. Further, if a burst error of one- to four-bit length occurs in another memory cell, there are two errors in at least one code word. These two errors can be detected and one of them can be corrected.

Another modification besides the modifications of the second and the third embodiments of the method of data writing according to the present invention will be described hereinbelow.

For example, 56 bits of "0" are added to 64 pieces of original data to obtain 120-bit data. A 127-bit length hamming code is obtained on the basis of the 120-bit data. All the 127 bits are EX-ORed to obtain a 128-bit code. The additional 56-bit "0" are removed from the 128-bit code to obtain a 72-bit code word.

This coding method is capable of correcting one error and detecting two errors per bit of a code word and often used as the SEC/DED code (Single-Error-Correction/Double-Error-Detecting Code) for main memories.

A practical example that the error correction is enabled even if one error occurs in a single code word will be described hereinbelow. A table below lists Hamming codes in which three redundant bits are added to four data bits.

TABLE 1

| DIGITS: | 1234567 |
|---|---|
| BIT WEIGHT: | CC8C421 |
| 0 = | 0000000 |
| 1 = | 1101001 |
| 2 = | 0101010 |
| 3 = | 1000011 |
| 4 = | 1001100 |
| 5 = | 0100101 |
| 6 = | 1100110 |
| 7 = | 0001111 |
| 8 = | 1110000 |
| 9 = | 0011001 |
| 10 = | 1011010 |
| 11 = | 0110011 |
| 12 = | 0111100 |
| 13 = | 1010101 |
| 14 = | 0010110 |
| 15 = | 1111111 |
| Digits: | 1234567 |
| Read code: | 0101100 |
| (4, 5, 6, 7) digit parity: | ---- → 0 |
| (2, 3, 6, 7) digit parity: | -- -- → 1 |
| (1, 3, 5, 7) digit parity: | - - - - → 1 |
| Error digit: | 011 = 3 |

In these Hamming codes, 1, 2 and 4 digits are redundant bits, and these bits are decided in such a way that an even parity can be obtained in each digit set of (1, 3, 5, 7), (2, 3, 6, 7) and (4, 5, 6, 7). For instance, when a code "0111100" corresponding to a decimal number of [12] is written, in case an error occurs so that a code "0101100" is read, it is possible to obtain an error digit by a binary number (011 in this case) as shown in TABLE 1. Therefore, even if an error occurs, it is possible to correct the error securely.

Further, when the number of data bits is increased, since this code can be extended to that number, the number of redundant bits m necessary for the n number of data bits can be expressed as $$2^m = n + m + 1 \quad (1)$$

In the above description, the case where the present invention is applied to a non-volatile memory device having floating gate type memory cells has been described. However, without being limited only to the floating gate type memory cell, the present invention can be of course applied to MNOS (Metal-Nitride-Oxide-Silicon) type semiconductor memory devices.

Further, the present invention can be applied to EPROMs, PROMs, mask ROMS, etc. in addition to the EEPROMs. In the mask ROMs, a memory status can be obtained by changing the threshold level thereof on the basis of the control of impurity quantity put in the channel region of a field effect transistor by ion implantation.

Further, the four- and eight-level memory cells have been described by way of example hereinabove. However, the data writing according to the present invention is not of course limited to only these levels.

Further, as a method of obtaining error correction codes, although interleaving has been explained, as far as an error of a burst length corresponding to the data quantity stored in the memory cell can be corrected by means of the error correction code, another method can be of course adopted, such as cyclic codes or compact cyclic codes.

Figure 13:
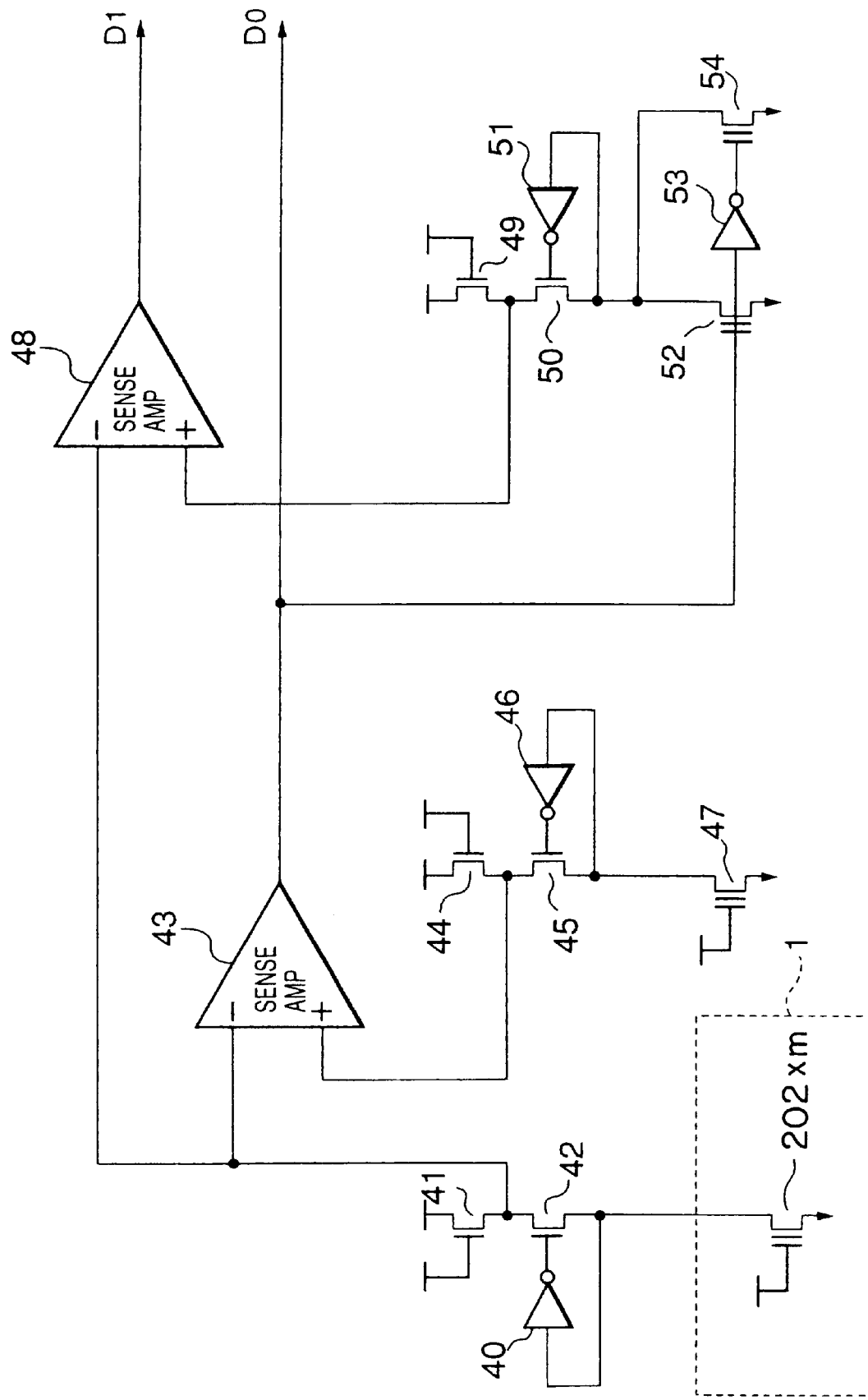
FIG. 13 is a circuit diagram of a sensing circuit.

In order to read the data stored in the memory cells $202_{x0}$ to $202_{xm}$ as the cipher key in the STEPS S400 of FIG. 5 and S402 of FIG. 6, the sense circuit 404 of FIG. 3 can be structured as a circuit shown in FIG. 13.

Described below is an operation of reading data stored in the memory cell $202_{xm}$ as the cipher key by the sense circuit 404.

In FIG. 13, a threshold voltage Vth1 is applied to the inverting input terminal of a sense amplifier 43 via first output buffer. The first output buffer includes an inverter 40 and transistors 41 and 42. The threshold voltage Vth1 corresponds to a low-order bit D0 set in the memory cell $202_{xm}$. Applied to the non-inverting input terminal of the sense amplifier 43 via second output buffer is a judging voltage V47 set in a transistor 47. The second output buffer includes an inverter 46 and transistors 44 and 45.

When the threshold voltage Vth1 is smaller than the judging voltage V47, the output of the sense amplifier 43 becomes HIGH. Thus, the low-order bit D0 is read as "1".

Since the output of the sense amplifier 43 is HIGH, a transistor 52 turns on, while a transistor 54 turns off due to the existence of an inverter 53 provided between both transistors.

A judging voltage V52 set in the transistor 52 is thus applied to the non-inverting input terminal of a sense amplifier 48 via third output buffer. The third output buffer includes an inverter 51 and transistors 49 and 50.

Further, a threshold voltage Vth2 corresponding to a high-order bit D1 set in the memory cell $202_{xm}$ is applied to the inverting input terminal of the sense amplifier 48 via first output buffer.

When the threshold voltage Vth2 is smaller than the judging voltage V52, the high-order bit D1 is read as "1" because the output of the sense amplifier 48 becomes HIGH. On the other hand, when Vth2 is greater than V52, the high-order bit D1 is read as "0" because the output of the sense amplifier 48 becomes LOW.

Next, when the threshold voltage Vth1 is greater than the judging voltage V47, the low-order bit D0 is read as "0" because the output of the sense amplifier 43 becomes LOW.

Since the output of the sense amplifier 43 is LOW, the transistor 52 turns off, while the transistor 54 turns on due to the existence of the inverter 53. A judging voltage V54 set in the transistor 54 is applied to the non-inverting input terminal of the sense amplifier 48 via third output buffer. Applied to the inverting input terminal of the sense amplifier 48 is the threshold voltage Vth2 via first output buffer.

When the threshold voltage Vth2 is smaller than the judging voltage V54, the high-order bit D1 is judged to be "1" because the output of the sense amplifier 48 becomes HIGH. On the other hand, when Vth2 is greater than V54, the high-order bit D1 is read as "0" because the output of the sense amplifier becomes LOW.

The data read as described above in STEPS S400 of FIG. 5 and S402 of FIG. 6 are stored in the memory 304 of FIG. 4 as cipher keys.

In the embodiments described above, EEPROM memory cells are used as the memory cells $202_{x0}$ $202_{xm}$. Not limited to this, another memory cell, such as multilevel memory cell composed of a ferroelectric random access memory (FRAM) described in Japanese Patent Laid-Open No. 8(1996)-124378 can be used.

In detail, each of the memory cells $202_{x0}$ to $202_{xm}$ is constructed by a field effect transistor (FEMFET) with a ferroelectric gate insulating film. Change in threshold level of each memory cell due to change in polarization of the ferroelectric film is used to store three values "High", "Low" and "-High" in each cell. FRAM memory cells used as the memory cells $202_{x0}$ to $202_{xm}$ achieve more complex cipher keys than by EEPROM memory cells with higher security protection against unauthorized rewriting by a third party.

Further, as the memory cells $202_{x0}$ to $202_{xm}$, other multilevel memory cells of MNOS, mask ROM, RPROM, PROM and flash non-volatile memory can be used.

Now, the third embodiment of the semiconductor device according to the present invention will be described. The difference between the first and second embodiments, and the third embodiment is the write control circuit. And, hence a write control circuit 103a shown in FIG. 14 employed by the third embodiment only is explained.

In FIG. 14, the write control circuit 103a is provided with a control circuit 311 to which a command signal is supplied, a program memory 312 to which a control program of the control circuit 311 is stored. The write control circuit 103a is further provided with a pattern memory 313 that stores a plural kind of pattern data (reference signals) of command signals for attempting to destroy the logic of the logic integrated circuit 100.

The program memory 312 pre-stores a control program according to a flow chart shown in FIG. 15. And, this control program is read and executed by the control circuit 311 for an operation of the write control circuit 103a as follows:

The control circuit 311 first determines whether an external command signal is supplied thereto in STEP S411. If the command signal is supplied, the process goes to STEP S412, however, if not, the process enters in a command waiting mode.

The control circuit 311 accepts the command signal in STEP S412 and examines whether there is a pattern data among the plural kind of the pattern data stored in the pattern memory 313 that corresponds to the command signal in STEP S413.

In detail, the pattern memory 313 pre-stores a plural kind of pattern data corresponding to signals considered to be rewrite command signals, that is, viruses for attempting to destroy the logic of the logic integrated circuit 100. The control circuit 311 compares the pattern data of the command signal and the pattern data of the memory 313 to determine whether the command signal is a virus or not.

In STEP S413, if there is a pattern data in the pattern memory 313 that corresponds to the command signal, the control circuit 311 recognizes that a virus is entered to attempt to destroy the logic of the logic integrated circuit 100. Then, the control circuit 311 makes the command signal invalid and the process returns to STEP S411 to repeat the following steps.

On the other hand, if there is no pattern data in the pattern memory 313 that corresponds to the command signal, the control circuit 311 makes the command signal valid and rewrites the memory statuses of the EEPROM memory cells $202_{x0}$ to $202_{xm}$ according to the command signal. Then, the process returns to STEP S411 to repeat the following steps.

As described above, according to this embodiment, when an external rewrite command signal is entered, judgement is made as to whether the command signal is a virus to attempt to destroy the logic of the logic integrated circuit 100. And, only the case where the command signal is not a virus, rewriting of the memory statuses of the memory cells $202_{x0}$ to $202_{xm}$ is allowed.

Accordingly, even if a rewrite command signal is entered to attempt to destroy the logic of the logic integrated circuit 100, the command signal is judged as a virus and rewriting is prohibited. Thus, an unauthorized rewriting of the logic of the logic integrated circuit 100 is disabled.

Therefore, in addition to the first and second embodiments, the third embodiment of the semiconductor device according to the present invention can protect the logic of the logic integrated circuit 100 from an unauthorized rewriting. The present invention thus can provide a rewritable logic integrated circuit with high durability against logic destruction.

With respect to the pattern data stored in the pattern memory 313, whenever a new virus pattern is found, it is stored in the memory 313 for higher durability against logic destruction.

In the first to the third embodiments of the semiconductor device according to the present invention, An EEPROM type logic integrated circuit is used as the circuit 100, however, not only limited to this, a SRAM type is also can be used.

Described below is the fourth embodiment of the semiconductor device with a security protection function according to the present invention.

As shown in FIG. 16, a semiconductor device 500 is provided with a memory device 501 having a mask ROM 501a and an EEPROM 501b. The memory device 501 has a small area enough for storing data and is capable of data rewriting. The mask ROM 501a stores ciphered secret data. Here, since the data stored in the mask ROM 5011a is ciphered, even if the structure is analyzed under a microscope, it is hardly possible to decipher the data.

Further, the semiconductor device 500 is provided with an FPGA (Field Programmable Gate Array) 502 of SRAM (Static Random Access Memory) type, and a CPU (Central Processing Unit) 503 as an arithmetic unit. Here, the FPGA implies a large-scale PLD (Programmable Logic Device) widely used recently as a general purpose logic integrated circuit. A user can electrically programs the FPGA 502 to calculate input data to obtain the output data. Further, the FPGA 502 is a circuit for calculation at a high speed in a hardware way.

The FPGA 502 has the same structure as the logic integrated circuit 100 in the first to the third embodiments of the semiconductor device according to the present invention and also the same security protection function. And, hence a detailed explanation of the structure and function the same as those of the logic integrated circuit 100 in the first to the third embodiments is omitted here.

FIG. 16 further shows an external apparatus 600 for accepting stored data connected to the semiconductor device 500 via output terminal 509. The external apparatus 600 is provided with a recording/reproducing apparatus 601 and a storage medium 602.

A method of deciphering secret data stored in the mask ROM 501a can be achieved with the FPGA 502 to convert a logical address AD-1 used for the CPU 503 into a structural address AD-2 used for the mask ROM 501a. Here, the structural address AD-2 is used to decipher and further read a lump of data ciphered and stored at scattered (at random) positions in the mask ROM 501a. In other words, as described later, the FPGA 502 receives the logical address AD-1 from the CPU 503, converts the logical address AD-1 into the structural address AD-2, and outputs the converted addresses to the mask ROM 501a.

An example of the deciphering operation of the semiconductor device 500 shown in FIG. 16 will be explained hereinbelow with reference to a flowchart shown in FIG. 17.

In FIG. 17, the power is on and the semiconductor device 500 is connected to the external apparatus 600 in step S701. Then, the CPU 513 is activated to request the external apparatus 600 to designate a logical operation program P to be set to the FPGA 502 in step S702.

In response to this request, the recording/reproducing apparatus 601 reproduces a program data from the storage medium 606, and further transmits the data to the semiconductor device 500.

In step S703, a data I/O section 504 receives the transmitted data and then, in step S704, the CPU 503 interprets the received data and outputs the program P to program the FPGA 502.

By means of the security protection function as already described, it is determined whether the logic of the FPGA 502 has been destroyed by a virus program or the program P is a virus program for attempting logic destruction, thus destruction of the logic of the FPGA 502 can be prevented. Therefor, when wrong or false data is input, the semiconductor device 500 is not set to the state where the data stored therein can be output correctly. The programming of the FPGA 502 is conducted by assembling AND and OR circuits freely, by turning some transistors on and others off among a great number of transistors previously arranged.

In the case of the logic circuits previously assembled by a predetermined logic, AND and OR circuits can be discriminated by tracing the wiring of the gate array under a microscope. It is thus possible to easily cipher the logic previously set to the logical circuits.

In contrast with this, since the fourth embodiment employs the FPGA 502, it is hardly possible to decipher the set logic even if the circuit structure is analyzed under a microscope. Because any desired logic can be assembled later on the basis of the presence and absence of electric charges of transistors.

Upon end of this programming, in step S705, the CPU 503 transmits a signal indicative of that data can be output, to the external apparatus 600 via data I/O section 504. In response to the signal, data of a logical address is requested to be output from the external apparatus 600. In step S706, the CPU 503 receives the logical address AD-1 via data I/O section 504 and outputs the address to the FPGA 502.

In step S707, the FPGA 502 calculates the structural address AD-2 on the mask ROM 501a on the basis of the logical address AD-1 in accordance with the program set in the step S704. The calculated structural address AD-2 is output to the mask ROM 501a. Further, in step S708, the mask ROM 501a outputs data D to the CPU 503 on the basis of the structural address AD-2 calculated by the FPGA 502. The CPU 503 then outputs the data D to the external apparatus 600 via data I/O section 504.

As described above, the fourth embodiment employs the FPGA 502 to decipher the ciphered data. Therefore, after programming the FPGA 502, it is possible to output the data at high speed. Further, the CPU 503 conducts data output only while the data are being output. The CPU 503 thus can execute other calculations. In this case, the CPU 503 can of course execute other data processing by use of the data stored in the masked ROM 501a. In addition, the circuit scale of the FPGA 502 is smaller than that of the EEPROM. The FPGA 502 thus can be formed at a high integration rate, so that the cost of the semiconductor device can be reduced.

Further, the logic of the FPGA 502 is surely protected by the logic security protection function so that constant accurate operation of the semiconductor device 500 is attained for high performance.

As described above, since the fourth embodiment employs FPGA 502 of SRAM type, the data stored in the FPGA 502 are all destroyed when the power is off. Therefore, when the power is on again, it is necessary to execute the programming of the FPGA 502 again. However, this problem can be solved by use of the FPGA of EEPROM type, instead of the FPGA of SRAM type.

Here, an example of the ciphering operation for storing the ciphered data in the EEPROM 501b shown in FIG. 16 will be explained hereinbelow with reference to a flowchart shown in FIG. 18.

In FIG. 18, in step S710, when the power is on, the semiconductor device 500 shown in FIG. 16 is connected to the recording/reproducing apparatus 601 and the storage medium 602. Then, in step S711, the CPU 503 is activated to request the external apparatus 600 to designate the logical operation program P to be set to the FPGA 502.

In response to this request, the recording/reproducing apparatus 601 reproduces program data from the storage medium 602, and further transmits the data to the semiconductor device 500. In step S712, the data I/O section 504 receives the transmitted data. Then, in step S713, the CPU 503 interprets the received data and programs the FPGA 502. Here, since the FPGA 502 is provided with the logic security protection function, when wrong or false data is input, the semiconductor device 500 is not set to the state where the data stored in the semiconductor device can be input correctly.

Upon end of this programming, in step S714, the CPU 503 transmits a signal indicative of that data can be input, to the external apparatus 600 via data I/O section 504. In response to the signal, data of a logical address is requested to be input from the external apparatus 600. In step S715, the CPU 503 receives the logical address AD-1 via data I/O section 504, the CPU 503 outputs the received logical address AD-1 to the FPGA 502.

In step S716, the FPGA 502 calculates the structural address AD-2 on the EEPROM 501b on the basis of the logical address AD-1 in accordance with the program set in the step S704, and outputs the calculated structural address to the EEPROM 501b. Further, in step S717, data is input from the external apparatus 600 to the CPU 503 via data I/O section 504, and then stored as the structural AD-2 to the EEPROM 501b. When a user wants to change a cipher key, it can be stored in the FPGA 502.

As described above, the semiconductor device 500 shown in FIG. 16 further employs the FPGA 502 with the logic security protection function to cipher the data to be stored. Therefore, after programming the FPGA 502, it is possible to input the data at high speed. Further, the CPU 503 executes data input only while the data is being input. The CPU 503 thus can execute other calculations.

Here, an example of the method of calculating the structural address AD-2 by the FPGA 502 in step S716 will be explained hereinbelow.

Here, the assumption is made that the EEPROM 501b has the addresses in the range of 0000h to FFFFh. In this case, the arrangement of data to be stored according to the capacity of the EEPROM 501b exists from the number 0000h to the number FFFFh. Then, the data are rearranged in accordance with a predetermined rule, and then stored in the EEPROM 501b.

Table 1 lists a practical rearrangement of the data. In the case of the ABABh-th data, ABABh data is represented by binary numerals as $(1010\ 1011\ 1010\ 1011)_2$, and further these values are shifted to the left as $(0101\ 0111\ 0101\ 0111)_2$; in other words, the ABAB-th data is rearranged as the 5757h-th data.

TABLE 1

| | | | |
|---|---|---|---|
| 0000h | $(0000\ 0000\ 0000\ 0000)_2$ → | 0000h | $(0000\ 0000\ 0000\ 0000)_2$ |
| 0001h | $(0000\ 0000\ 0000\ 0001)_2$ → | 0002h | $(0000\ 0000\ 0000\ 0010)_2$ |
| 0002h | $(0000\ 0000\ 0000\ 0010)_2$ → | 0004h | $(0000\ 0000\ 0000\ 0100)_2$ |
| 0003h | $(0000\ 0000\ 0000\ 0011)_2$ → | 0006h | $(0000\ 0000\ 0000\ 0110)_2$ |
| ... | ... ... ... ... | ... | ... ... ... ... |
| ABABh | $(1010\ 1011\ 1010\ 1011)_2$ → | 5757h | $(0101\ 0111\ 0101\ 0111)_2$ |
| ABACh | $(1010\ 1011\ 1010\ 1100)_2$ → | 5759h | $(0101\ 0111\ 0101\ 1001)_2$ |

TABLE 1-continued

| | | | | |
|---|---|---|---|---|
| ... | ............ ... | | ... | ............ ... |
| FFFDh | (1111 1111 1111 1101)$_2$ → | FFFBh | (1111 1111 1111 1011)$_2$ |
| FFFEh | (1111 1111 1111 1110)$_2$ → | FFFDh | (1111 1111 1111 1101)$_2$ |
| FFFFh | (1111 1111 1111 1111)$_2$ → | FFFFh | (1111 1111 1111 1111)$_2$ |

In accordance with the newly formed arrangement, the data given externally are stored in the respective addresses of the EEPROM 501b via data I/O section 504 and CPU 503. Therefore, the arrangement of the data stored in the EEPROM 501b is a ciphered arrangement different from the original data arrangement, so that it is impossible to decipher the original data.

In order to decipher the data ciphered and then stored in the memory device 600 (i.e., processing in step S707 of FIG. 17), the structural address AD-2 is calculated that is shifted to the left from the logical address AD-1 input from the CPU 503 to the FPGA 502, and further the program for deciphering the address is written in the FPGA 502. Then, it is possible to read the data deciphered in accordance with this program.

As another practical rearrangement of the data, in Table 1, ABABh data, for instance are represented by binary numerals as (1010 1011 1010 1011)$_2$. Further a value (0110 1101 0101 1100)$_2$ is obtained by finding an exclusive logical sum of the above-mentioned binary numerals and a random number (1100 0110 1111 0111)2, and the obtained value is rearranged at the 6B5Ah-th address. Further, in accordance with the newly formed arrangement, the data given externally are stored in the respective addresses of the EEPROM 501b via data I/O section 504 and CPU 503.

As described later, the present invention can be applied to an IC card, so that, when a user requests to add a new personal data or update the personal data already stored, it is possible to make smaller the capacity of the mask ROM 1a while enlarging that of the EEPROM 501b to enlarge rewritable memory area. Further, a volatile memory, such as a DRAM, can be used instead of the EEPROM 501b.

Further, in the above-mentioned ciphering and deciphering processing, an addressing program is written in the FPGA 502 when the EEPROM 501b is used.

A data processing apparatus using FPGA is disclosed in Japanese Patent Laid-Open No. 7(1995)-168750. The data processing apparatus is provided with an FPGA connected to a memory storing program data. A CPU controls logic circuit of the FPGA under the program data. The data processing apparatus executes data communications between the CPU and peripheral units on the basis of this programmed FPGA. However the data processing apparatus does not disclose that: ciphering and deciphering programs are written in FPGA by the data supplied from the CPU; data ciphered by the FPGA is stored in the memory; and the ciphered and stored data is deciphered, like the case of the present invention. Further, the data processing apparatus does not disclose logic security protection function for a constant accurate operation of the apparatus.

A fifth embodiment of the semiconductor device with a security function according to the present invention will be described hereinbelow with reference to FIG. 19.

As shown in FIG. 19, in the same way as with the case of the fourth embodiment, a semiconductor device 510 is provided with a memory device 511 having a mask ROM 511a and an EEPROM 511b, an FPGA 512 and a CPU 513. The FPGA 512 is used as an interface circuit for ciphering or deciphering data. Further, the FPGA 512 is provided with the logic security protection function like the FPGA 502 in the forth embodiment.

The fifth embodiment is different from the fourth embodiment in that an address designated by an external apparatus 600 is input to the memory device 511 directly from the CPU 513 and a structural data D-2 output from the memory device 511 is converted into a logical data D-1 by the FPGA 512 and input to the CPU 513.

In more detail, in the fifth embodiment, the method of deciphering secret data stored in the memory device 511 is executed when the FPGA 512 converts the structural data D-2 (ciphered data) read from the mask ROM 511a into the logical data D-1 used by the CPU 513. In other words, the FPGA 512 receives the structural data D-2 from the mask ROM 511a and converts the data D-2 into the logical data D-1 of the CPU 513. Then, the logical data D-1 is output to the CPU 513.

Figure 20:
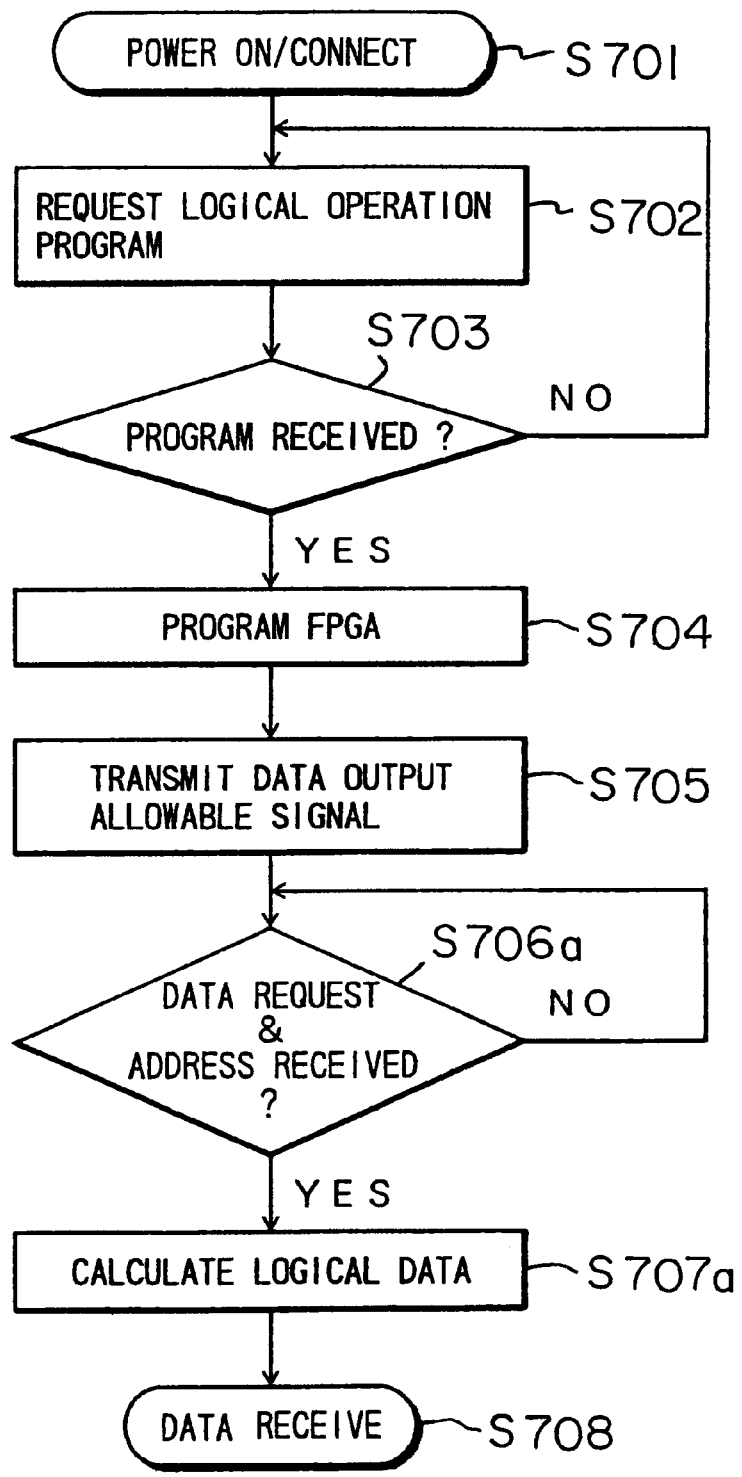
FIG. 20 is a flowchart showing an example of the deciphering operation of the semiconductor device shown in FIG. 19.

The operation of the fifth embodiment of the semiconductor device 510 shown in FIG. 19 is the same as with the case of the fourth embodiment from when the power is on (in step S701) to when the data are output (in step S705) in FIG. 20. However, the operation of the fifth embodiment is different from that of the fourth embodiment after the step S705.

In more detail, in step S706a as shown in FIG. 20, when data of an address is requested to be output from the external apparatus 600 and the address is received by the data I/O section 514, the CPU 513 outputs the received address to the FPGA 512. The FPGA 512 calculates the logical data in STEP S707a based on the program set in STEP S704. The calculated logical data is then stored on the address (given by the CPU 513) of the EEPROM 511b.

On the other hand, in FIG. 21, when data of an address is requested to be output from the FPGA 512 and the address is received by the data I/O section 514, the CPU 513 outputs the received address AD to the memory device 511.

Then the FPGA 512 calculates the structural data D-2 on the basis of the program set in STEP S713. The structural data D-2 is stored on the address (given by the CPU 513) of the EEPROM 511b.

As described above, the fifth embodiment also employs the FPGA 512 to cipher data to be stored. Therefore, after the program is executed by the FPGA 512, it is possible to output the data at high speed. Further, since the CPU 513 executes data output only while the data are being output, the CPU 30 can execute other calculations.

Here, an example of the method of calculating the structural addresses by the FPGA 512 in step S716a of FIG. 21 will be explained hereinbelow.

The assumption is made that one word (word length) of 16-bit data is read from the EEPROM 511b per address. These 16-bit data are rearranged in accordance with a predetermined rule, and then stored in the EEPROM 511b.

For instance, in the case of the 16-bit data of ABABh, the ABABh data is represented by binary numerals as (1010 1011 1010 1011)$_2$, and further these values are shifted to the left as (0101 0111 0101 0111)$_2$; in other words, data 5757h is stored in the EEPROM 511b.

As a result, since the ciphered data stored in the EEPROM 511b are different from the original data, it is impossible to decipher the original data.

In order to decipher the data ciphered and then stored in the EEPROM 511b (i.e., processing in step S707a in FIG. 20), when a program for shifting the obtained 16-bit data to the left is written in the FPGA 512, it is possible to read the data deciphered in accordance with this program.

Further, when a user requests to freely rewrite the stored contents electrically in the fifth embodiment in the same way as with the case of the fourth embodiment, it is possible to enlarge the capacity of the EEPROM 511b. In this case, a program for ciphering data is written in the FPGA 512, the data supplied by the CPU 513 are ciphered by the FPGA 512, and the ciphered data are supplied to the EEPROM 511b.

Further, in the above-mentioned ciphering and deciphering processing, an addressing program is written in the FPGA 512, when data is written in the EEPROM 511b.

Further, in the second embodiment, since the FPGA 512 of SRAM type is used, when the power is off, the data stored in the FPGA 512 are all destroyed. Therefore, when the power is on again, it is necessary to execute the programming (writing the program for ciphering data) of the FPGA 512 again. However, this problem can be solved by use of the FPGA of EEPROM type, instead of the FPGA of SRAM type.

In this case, codes are allocated to a plurality of programs for programming the FPGA 512. When the FPGA 512 is programmed, the FPGA 512 is programmed in accordance with a program selected from a plurality of the programs. In this case, the program code is also stored.

When accessing the programmed FPGA 512, the stored program code is output to an external unit via CPU 513. On the basis of the output program code, the external unit changes the way of accessing the semiconductor device 510. In other words, since the semiconductor device 510 and the external unit use this program code as a common key, it is possible to decipher secret data in cooperation.

For instance, on the external unit side, an address per byte is shifted by predetermined bits for ciphering and then supplied to the semiconductor device 510. The FPGA 512 shifts the bits of the supplied address in the opposite direction to obtain an address for the memory device 511.

In this case, although the contents themselves stored in the EEPROM 511b are common, when the bit shift rates are changed whenever the data are written in the FPGA 512, a plurality of ciphering methods can be achieved. Therefore, when rewritten very often, it is possible to increase the secrecy degree. Further, in the actual ciphering processing, a more complicated conversion method is adopted on a peripheral unit side, without use of the simple conversion method such as bit shift or reverse bit shift.

Further, in the semiconductor devices shown in FIGS. 16 and 19, it is also possible to adopt such a method that data are stored in the memory device 501 or 511 without ciphering, but ciphered by the FPGA 502 or 512, before output. For instance, in order to prevent secret contents from being leaked due to the interception of communications between the semiconductor device of the present invention and an external unit, the above-mentioned methods can be adopted effectively when the communications contents must be ciphered.

In this case, in the fourth embodiment, for instance, secret data output from the CPU 503 to the external apparatus 600 via I/O section 504 can be ciphered as follows: the CPU 503 sets a program for interpreting and ciphering data output from the external apparatus 600 to the FPGA 502. Further, the FPGA 502 converts the logical address AD-1 supplied from the CPU 503 into the structural address AD-2.

Further, in the fifth embodiment, for instance, secret data output from the CPU 513 to the external apparatus 600 via I/O section 514 can be ciphered as follows: the CPU 513 sets a program for interpreting and ciphering data output from the external apparatus 600 to the FPGA 512. Further, after that, the FPGA 512 converts the structural data D-2 (not ciphered data) read from the mask ROM 511a into the logical data D-1 (ciphered data) used for the CPU 513, for ciphering processing.

Further, as the sixth embodiment, it is possible to combine the fourth and the fifth embodiments in such a way that both addresses and data are ciphered and deciphered by use of the FPGAs. This sixth embodiment can be achieved by providing the FPGA 502 shown in FIG. 16 used for address conversion and the FPGA 512 shown in FIG. 19 used for data conversion separately, and by setting an appropriate program to each FPGA, independently.

Next, the seventh embodiment of a semiconductor device with a security function according to the invention will be explained with reference to FIG. 22.

Figure 22:
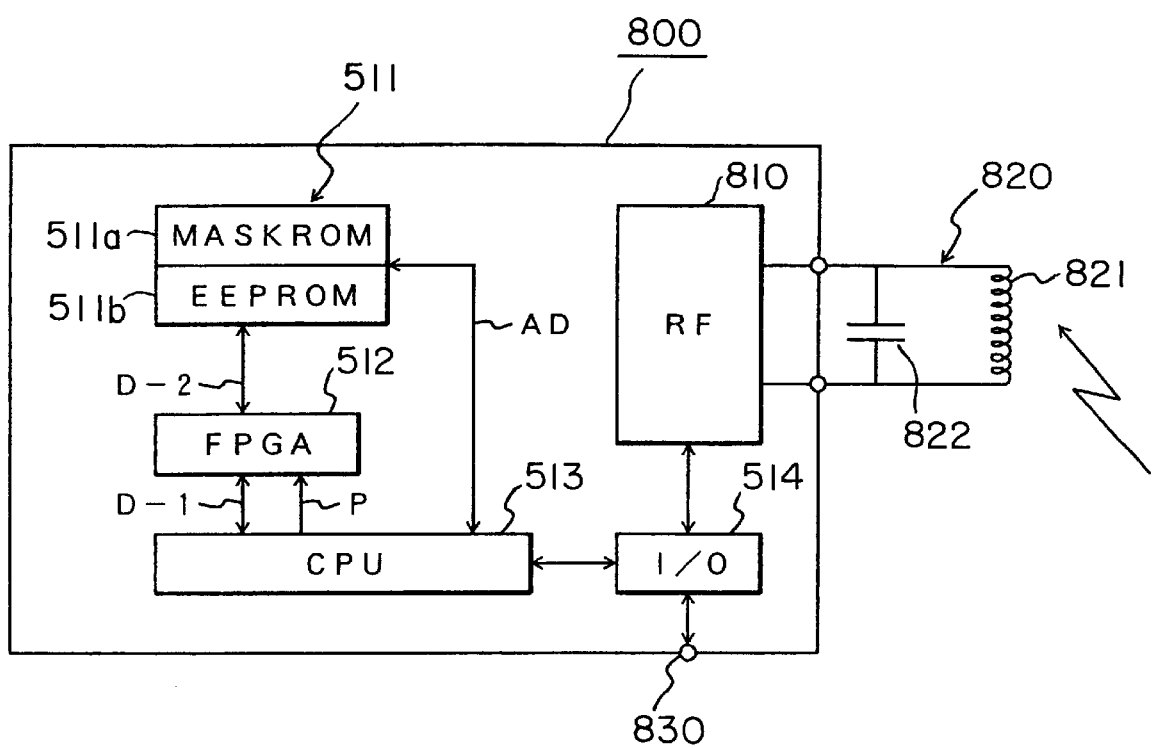
FIG. 22 is a block diagram showing still another embodiment of the semiconductor device according to the present invention.

A semiconductor device 800 shown in FIG. 22 corresponds to the semiconductor device 510 shown in FIG. 19 provided with a radio frequency (RF) section 810 and an antenna circuit 820. In this embodiment, a memory device 511 is provided with a mask ROM 511b and an EEPROM 511b for storing changeable data. Further, a FPGA 512 is provided with a logic security protection function.

The antenna circuit 820 is a parallel oscillating circuit composed of a coil 821 and a capacitor 822. The antenna circuit 820 has functions of receiving power for the semiconductor device from a terminal equipment (not shown) and data communications with the terminal equipment. For example, the antenna circuit 60 is capable of wireless data transmission by means of a high frequency carrier of 1 MHz or more.

In FIG. 22, when a radio wave is received via coil 821 from the terminal equipment, the power is supplied from the radio wave to the RF section 810. The RF section 810 is a circuit for high frequency processing. Thus, the RF section 810 generates a supply voltage from the power to be used in the semiconductor device. Further, the RF section 810 demodulates a signal included in the power, the signal being supplied to the I/O section 514.

Other operations besides that described above are the same as those described with reference to FIG. 19.

When a signal is output from the semiconductor device 800 shown in FIG. 22 to a terminal equipment, the operation is in reverse order of the signal reception described above. In detail, the RF section 810 generates a high frequency current by modulating the signal from the I/O section 514 with a high-frequency carrier signal. The generated high frequency current is supplied to the antenna circuit 820 and transmitted to the terminal equipment. In the case of signal transmission/receiving to/from the terminal, the semiconductor device 800 can receives a power from the terminal equipment.

As described above, since the semiconductor device 800 of the seventh embodiment is capable of non-contact communications to a terminal equipment, it can be installed in a non-contact type IC card.

Further, since the FPGA 512 is provided with the logic security protection function, the semiconductor device 800 is capable of preventing destruction of the stored data by an external unauthorized data to attain constant accurate operations.

For example, when an IC card with this semiconductor device is employed as a commuting ticket, a commuter can pass a gate as the terminal equipment without contact. Thus, this can relieve congestion at the gate greatly.

When the present invention is applied to a commuting ticket, there is a demand for updating of data, such as the expiry date on the commuting ticket. However, by means of the logic security function as described above, an unauthorized use of the commuting ticket with rewritten memory status by a third party is prevented.

As shown in FIG. 22, the semiconductor device 800 is provided with the mask ROM 511a and the EEPROM 511b.

Thus, the commuting ticket can be repeatedly used by storing changeable data in the EEPROM 511b.

The semiconductor device 800 is capable of non-contact data rewriting. This achieves higher data security function than that done by data communications via metallic contact.

Further, the semiconductor device 800 shown in FIG. 22 is provided with a terminal 830 to be used as a contact-type IC card. Moreover, the antenna circuit 820 is drawn in FIG. 22 as protruding from the semiconductor device 800. However, the antenna circuit 820 can be provided on the surface of an IC card installing the semiconductor device of FIG. 22.

Further, the present invention includes various devices connected to each device shown in FIGS. 3, 16, 19 and 22 to activate each device in order to achieve the above-mentioned embodiments, and further various methods of supplying software programs for achieving the above-mentioned embodiments to a system computer (CPU or MPU) and of activating the respective devices in accordance with the programs stored in the computer.

In this case, since the program codes of the software themselves achieve the above-mentioned embodiments, the program codes themselves and means for supplying the program codes to the computer (e.g., a storage medium for storing the program codes) constitute the present invention.

For instance, in FIG. 4, a recording/reproducing apparatus 305 and a storage medium 306 are connected to the control circuit 301. Therefore, the program codes stored in the storage medium 306 are read by the recording/reproducing apparatus 305 to activate the control circuit 301.

Further, in FIG. 16, the recording/reproducing apparatus 601 and the storage medium 602 both provided in the external apparatus 600 are connected to the CPU 503 via I/O section 504. Therefore, the program codes stored in the storage medium 602 are read by the recording/reproducing apparatus 601 to activate the CPU 503 via I/O section 504.

Further, as the storage medium for storing the program codes, a floppy disk, hard disk, optical disk, CD-ROM, magnetic tape, non-volatile memory card, ROM, etc., can be used, for instance.

As described above, the present invention provides the electrically rewritable semiconductor device with the logic security protection functions that is durable against logic destruction. This achieves constant accurate operation of a semiconductor device such as rewritable logic integrated circuit.

Further, as described above, the semiconductor device according to the present invention is provided with a memory device, a central processing unit, and electrically rewritable logic circuits. The logic circuits are provided with the logic security protection functions that is durable against logic destruction. The data ciphering and deciphering can be executed by rewriting the logic of the logical circuits in accordance with ciphering and deciphering programs set by the central processing unit. Further, the data input to the memory device are ciphered and deciphered by the logical circuits whose logic has been already rewritten.

As described above, since the electrically rewritable logic circuits are provided, the circuit configuration which can prevent its logic from being deciphered on the basis of structure analysis can be achieved in a smaller scale, as compared with conventional circuit configurations. In addition, since the logic set to the electrically rewritable logic circuits can be executed by way of hardware, the processing speed can be increased.

Further, the central processing unit can execute other processing between the two ciphering or deciphering operations. Therefore, it is possible to provide a semiconductor device with a security protection function for stored contents, by increasing the operation speed and by decreasing the manufacturing cost.

Further, according to the present invention, since data communications with a terminal equipment can be conducted without contact, there is little possibility of reading or destroying the stored data by the third party. Thus, the present invention can provide a semiconductor device suitable for an IC cared with the device installed therein.

What is claimed is:

1. A semiconductor device comprising:

a logic integrated circuit having a field programmable gate array storing logic data which is rewritable in response to an external command signal;

a comparing means for comparing first data being included in at least a reference signal and being related to the logic data of the logic integrated circuit and second data included in the command signal;

a control means for controlling rewriting of the logic data according to a result of the comparison; and a judging means for judging that the logic data has been rewritten when the first and second data are not identical to each other.

2. The semiconductor device of claim 1, wherein the judging means outputs a judging signal when it is judged that the logic data has been rewritten.

3. The semiconductor device of claim 1, wherein the judging means periodically conducts the judging operation.

4. The semiconductor device of claim 1, wherein the first data indicate at least either one of a date, an address and a code each related to the logic data.

5. The semiconductor device of claim 3, wherein the logic integrated circuit includes a plurality of multilevel memory cells each storing one of at least three memory states, each cell having a control gate and a floating gate.

6. The semiconductor device of claim 3, wherein the logic integrated circuit includes a non-volatile memory which is a member of the group consisting of an MNOS, a mask ROM, an EEPROM, an EPROM, a PROM and a FRAM.

7. The semiconductor device of claim 3 further comprising means for rewriting the logic data.

8. The semiconductor device of claim 3 further comprising means for reading the logic data.

9. The semiconductor device of claim 3 further comprising:

an antenna coil receiving the command signal carried by an electromagnetic wave; and means for demodulating the received command signal.

10. A semiconductor device comprising:

a logic integrated circuit having a field programmable gate array storing logic data which is rewritable in response to an external command signal;

a comparing means for comparing first data being included in at least a reference signal and being related to the logic data of the logic integrated circuit and second data included in the command signal;

a control means for controlling rewriting of the logic data according to a result of the comparison; and a memory means for storing a plurality of reference signals, the comparing means comparing the command signal with the plurality of reference signals, and the control means prohibiting rewriting of the logic data when the command signal and any one of the plurality of reference signals are identical to each other.

11. The semiconductor device of claim 10, wherein the second data included in the command signal is stored in the memory means when the command signal and any one of the plurality of reference signals are not identical to each other.

12. The semiconductor device of claim 10, wherein the plurality of reference signals are viruses.

13. A semiconductor device comprising:
a logic integrated circuit having a field programmable gate array storing logic data which is rewritable in response to an external command signal, the logic integrated circuit includes:
   a plurality of calculating means each capable of a specific calculation; and
   a wiring means for changing wiring among the plurality of calculators in response to the command signal to rewrite the logic data;
a comparing means for comparing first data being included in at least a reference signal and being related to the logic data of the logic integrated circuit and second data included in the command signal; and
a control means for controlling rewriting of the logic data according to a result of the comparison.

14. A semiconductor device comprising:
a logic integrated circuit having a field programmable gate array storing logic data which is rewritable in response to an external command signal;
a comparing means for comparing first data being included in at least a reference signal and being related to the logic data of the logic integrated circuit and second data included in the command signal;
a control means for controlling rewriting of the logic data according to a result of the comparison;
a generating means having at least a code processing program for generating the command signal corresponding to the program; and
a writing means responsive to the command signal for rewriting the logic data in accordance with the program, the control means controlling the writing means according to a result of the comparison.

15. The semiconductor device of claim 14, wherein the processing program includes at least either a ciphering or a deciphering program.

* * * * *